United States Patent [19]
Makita et al.

[11] Patent Number: 5,619,044
[45] Date of Patent: Apr. 8, 1997

[54] SEMICONDUCTOR DEVICE FORMED WITH SEED CRYSTALS ON A LAYER THEREOF

[75] Inventors: Naoki Makita, Nara; Yoshitaka Yamamoto, Yamatokoriyama, both of Japan

[73] Assignee: Sharp Kabushiki Kaisha, Osaka, Japan

[21] Appl. No.: 421,910

[22] Filed: Apr. 14, 1995

[30] Foreign Application Priority Data

Apr. 15, 1994 [JP] Japan .................................. 6-077699

[51] Int. Cl.$^6$ ........................ H01L 29/04; H01L 31/036
[52] U.S. Cl. ................ 257/64; 257/66; 257/74; 257/75
[58] Field of Search ............... 257/64–66, 70–75

[56] References Cited

U.S. PATENT DOCUMENTS

| | | | |
|---|---|---|---|
| 5,318,919 | 6/1994 | Noguchi et al. | 257/66 |
| 5,403,772 | 4/1995 | Zhang et al. | 257/66 |
| 5,442,198 | 8/1995 | Arai et al. | 257/66 |
| 5,468,974 | 11/1995 | Aronowitz et al. | 257/64 |
| 5,481,121 | 1/1996 | Zhang et al. | 257/64 |
| 5,486,237 | 1/1996 | Sano et al. | 257/75 |

FOREIGN PATENT DOCUMENTS

| | | |
|---|---|---|
| 6-244103 | 9/1994 | Japan . |
| 6-244104 | 9/1994 | Japan . |
| 7-58338 | 3/1995 | Japan . |

*Primary Examiner*—Sara W. Crane
*Attorney, Agent, or Firm*—David G. Conlin; Brian L. Michaelis

[57] ABSTRACT

According to the present invention, a semiconductor device and a method for producing a semiconductor device in which an active region made of a crystalline silicon film is formed on an insulating surface of a substrate is provided. The method includes the steps of: forming a first amorphous silicon film on the substrate; selectively introducing at least one kind of catalyst elements for promoting the crystallization of the first amorphous silicon film into a part of the first amorphous silicon film before or after forming the first amorphous silicon film; heating the first amorphous silicon film so as to crystallize the first amorphous silicon film in a direction substantially parallel to a surface of the substrate with respect to a region surrounding a region into which the catalyst elements are selectively introduced; forming an insulating thin film in a region on the crystalline silicon film in which crystals are grown in a direction substantially parallel to the surface of the substrate so as to partially remove the insulating thin film and the crystalline silicon film so that a linear boundary is formed along a crystal-growing direction of the crystalline silicon film; forming a second amorphous silicon film on the crystalline silicon film; and crystallizing the second amorphous silicon film by heating or by irradiating a laser beam or an intense light.

9 Claims, 15 Drawing Sheets

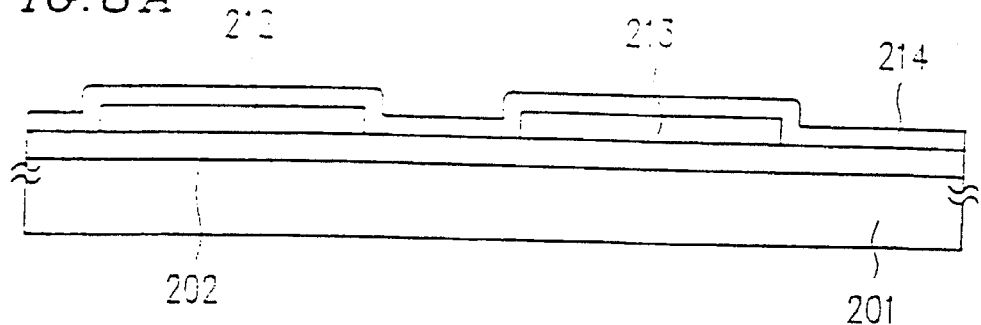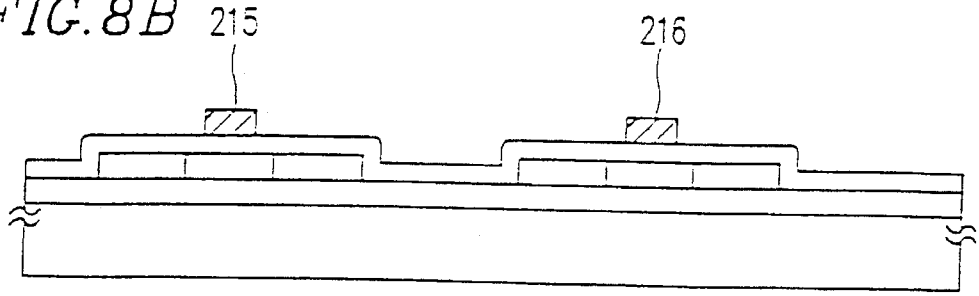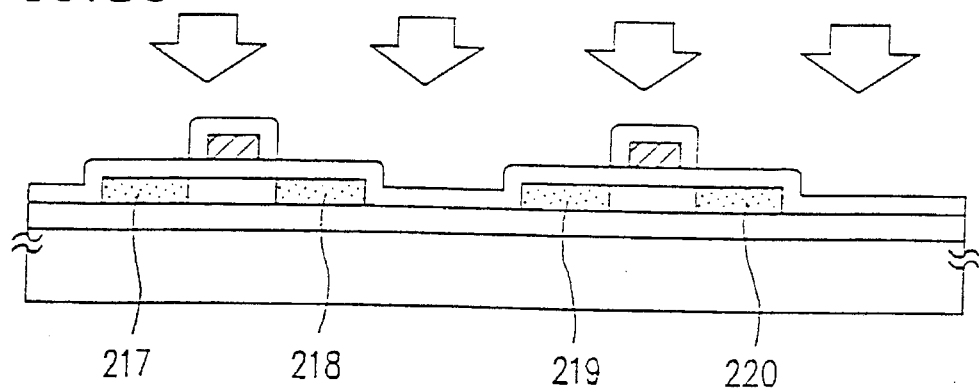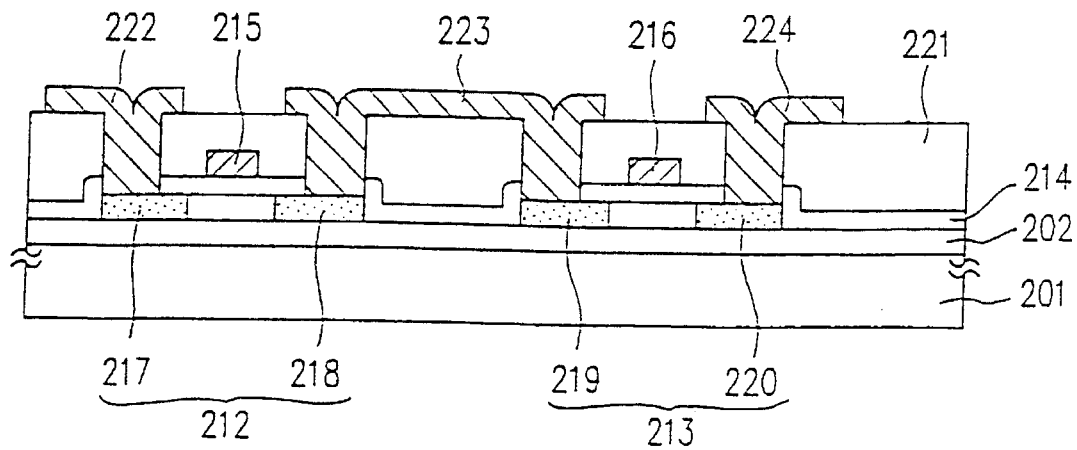

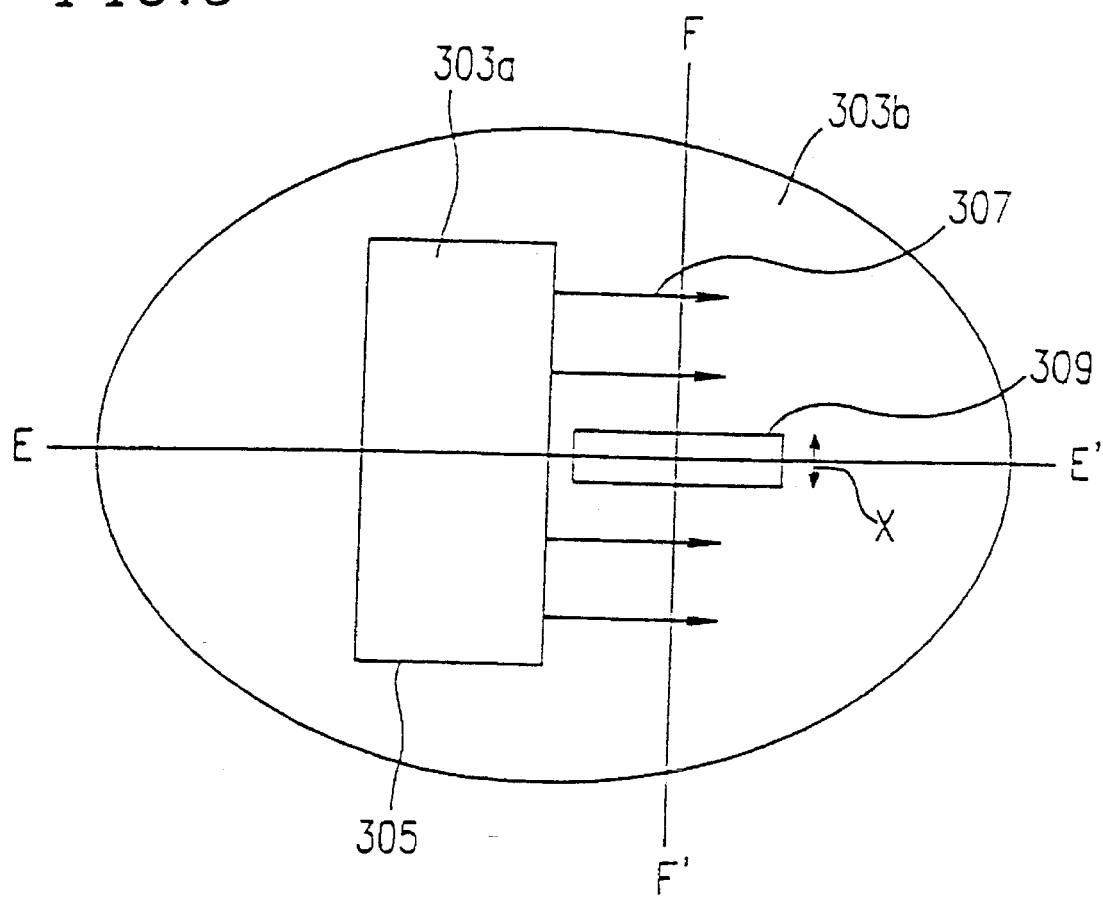

SEMICONDUCTOR DEVICE FORMED WITH SEED CRYSTALS ON A LAYER THEREOF

BACKGROUND OF THE INVENTION

1. Field of the Invention

The present invention relates to a semiconductor device in which an active region for a thin-film transistor (TFT) is formed on an insulating substrate or on an insulating film formed on a substrate; and a method for producing such a device. More particularly, the present invention relates to a semiconductor device which is useful to an active-matrix liquid crystal display device; and a method for producing such a device.

2. Description of the Related Art

It is known to use as a semiconductor device including TFTs on an insulating substrate made of glass, etc., an active-matrix liquid crystal display device using the TFTs for driving the pixels, an image sensor and the like. In general, a thin-film silicon semiconductor is used as a material for the active regions of the TFTs provided for such a device. Such a thin-film silicon semiconductor is roughly classified into two categories; namely, that made of an amorphous silicon (a-Si) semiconductor and that made of a crystalline silicon semiconductor.

Of the above-mentioned two types of thin-film silicon semiconductors, an amorphous silicon semiconductor is currently used most frequently for general applications. This is because an amorphous silicon semiconductor may be mass-produced using a vapor-phase growing method more easily and at a relatively low temperature as compared with a crystalline silicon semiconductor. Despite these advantages, the physical properties, e.g., conductivity, of the amorphous silicon semiconductor are inferior to those of the crystalline silicon semiconductor. Thus, in order to realize higher performance characteristics, there has been a great demand for the establishment of a method for producing a TFT having a crystalline silicon semiconductor. Examples of a crystalline silicon semiconductor include polycrystalline silicon, micro-crystalline silicon, amorphous silicon containing a crystalline component, and semi-amorphous silicon exhibiting an intermediate state between crystallinity and non-crystallinity.

The following three methods are currently employed for obtaining the above-mentioned thin-film silicon semiconductor exhibiting some crystallinity.

(1) A crystalline silicon semiconductor film is grown directly on a substrate during the deposition of the film.

(2) An amorphous silicon film is initially deposited, and subsequently crystallized using laser beam energy or the like.

(3) An amorphous silicon film is initially deposited, and subsequently crystallized by the application of thermal energy thereto.

These conventional methods, however, have the following problems.

In the case of employing method (1), the deposition and the crystallization of the film proceed simultaneously. Therefore, it is indispensable to deposit a thick silicon film in order to obtain a crystalline silicon composed of grains having a large size. However, it is technologically difficult to uniformly deposit a film having satisfactory semiconductor physical properties over the entire surface of a substrate. Furthermore, since such a film is deposited at a relatively high temperature of 600° C. or more, an inexpensive glass plate is unsuitable for a substrate which may be used in this method, so that the necessary cost becomes disadvantageously high.

In the case of employing method (2), a crystallization phenomenon is utilized during a process for melting and solidifying a film. As a result, the grain boundaries are satisfactorily treated even though the grain size of the resulting crystal is small. Thus, a crystalline silicon film of high quality may be obtained. In spite of these advantages, in the case of irradiating an excimer laser beam which is currently used most frequently, the area to be irradiated with a laser beam is small, so that throughput is disadvantageously low. In addition, the stability of the excimer laser is not sufficient in order to uniformly treat the entire surface of a large-scale substrate. In light of these problems, method (2) cannot help being regarded as a next-generation technology.

It is true that method (3) has an advantage of being applicable to the treatment of a larger-scale substrate as compared with methods (1) and (2), however according to method (3), a heat treatment is required to be conducted at a high temperature of 600° C. or more over several tens of hours so as to realize the crystallization. Thus, in order to reduce costs by using an inexpensive glass substrate and improve the resulting throughput, two incompatible purposes must be fulfilled at the same time: i.e., the heating temperature should be lowered for the purpose of reducing the cost; and the crystallization should be realized in a short period of time in order to improve the throughput. In addition, since method (3) utilizes a solid phase crystallization (epitaxy) phenomenon, crystal grains are laterally grown in parallel with respect to the substrate surface, so that grains having a size of several μm are obtained. As a result, the crystal grains thus grown come into contact with each other so as to form grain boundaries. Since these grain boundaries function as a trap level for carriers, the presence of the grain boundaries is very likely to cause the decrease in field-effect mobility of TFTs.

In view of solving the above-mentioned conventional problems, Japanese Patent Application No. 5-218156 discloses a method for producing a crystalline silicon thin film in order to fulfill at the same time the two purposes required for the crystallization, i.e., lowering the annealing temperature and the shortening the necessary process time; and to suppress the effects of the grain boundaries to a minimal level.

According to the method of the above-identified patent application, a very small amount (e.g., on the order of $1 \times 10^{18}$ cm$^{-1}$) of impurity elements such as nickel, palladium and zinc is introduced into an amorphous silicon film as a nucleus for crystal growth, thereby accelerating the nucleus generation rate at an initial stage of the crystallization and the nucleus growth rate in the subsequent stages. As a result, satisfactory crystallinity can be obtained at a low temperature of 580° C. or less for a short period of time of about four hours. The probable mechanism of this growth may be understood as follows: first, a crystal nucleus is generated by introducing impurity elements as a nucleus in an earlier stage; then, the impurity elements promote crystal growth as catalysts, thereby accelerating crystallization. Hereinafter, the impurity elements of this type will be referred to as "catalyst elements" in the above-described sense.

According to this method, aside from enabling crystallization with a laser beam, a crystalline silicon film and an amorphous silicon film may be selectively formed on one and the same substrate by introducing the catalyst elements into a portion of the substrate. On the other hand, if the heating process (annealing process) is further continued after crystallization, the portion in which the crystal has been growing (hereinafter, this portion will be referred to as a "crystal-growing portion") expands in a lateral direction (or a direction parallel to the surface of the substrate) from the crystallized portion by the selective introduction of the catalyst elements towards the amorphous portion surrounding the crystallized portion. Hereinafter, the crystal-growing portion in a lateral direction will be referred to as a "laterally growing portion". In this laterally growing portion, a plurality of needle-like or column-like crystals extend along the crystal-growing direction parallel to the substrate, and grain boundaries do not exist in the growing direction. Accordingly, if a channel potion for a TFT is formed using this laterally growing portion, then a high-performance TFT may be realized.

Referring to FIG. 14, a process for producing a TFT using this laterally growing portion will be described below. FIG. 14 is a plan view showing a TFT seen from above the upper surface of the substrate.

First, a mask constituted by an insulating film made of silicon dioxide or the like is deposited over the amorphous silicon film formed over the entire surface of the substrate. Then an opening 500 for adding catalyst elements is formed through the mask, and the catalyst elements are introduced through the opening 500 into the amorphous silicon film.

Next, a heat treatment (annealing) is conducted at approximately 550° C. for about four hours. As a result, the amorphous silicon film region under the opening 500 to which the catalyst elements have been added (catalyst element added region) is crystallized, while the other regions remain amorphous silicon. Then, the heat treatment is further continued for about eight hours, so that the crystal goes on laterally growing in the growing direction 501 extending from the catalyst element added region, thereby forming the laterally growing portion 502.

Subsequently, a TFT is formed according to a conventional method by using this laterally growing portion 502. In this case, if a source region 503, a channel region 504 and a drain region 505 are provided at the positions with respect to the laterally growing portion 502 as shown in FIG. 14, the moving direction of the carriers accords with the crystal growing direction 501. Consequently, a high mobility TFT in which grain boundaries do not exist in the moving direction of the carriers is realized.

In a TFT thus produced, the mobility of an N-channel type TFT is in the range of 80 to 100 cm$^2$/Vs, while the mobility of a P-channel type TFT is in the range of 60 to 80 cm$^2$/Vs. If such a TFT is used for a liquid crystal display device, then, in addition to the display portion, i.e., the switching elements in an active-matrix region, peripheral driving circuits such as an X decoder/driver and a Y decoder/driver may be fabricated on one and the same substrate during a single production step.

FIG. 15 is a block diagram showing an electrooptic system of a liquid crystal display device including a display, a CPU, memories and the like. In FIG. 15, the region surrounded by the one-dot chain is the region for producing the display portion on one and the same substrate made of glass, etc. by using the technique disclosed in above-mentioned Japanese Patent Application 5-218156. However, in order to fabricate a product at an even lower cost; to down-scale the module; and to simplify the mounting process, it is necessary to realize the integration at a higher level. Therefore, it is preferable to construct the entire electrooptic system on an identical substrate as shown in FIG. 15.

However, it is not sufficient to construct the entire system on an identical substrate. This is because the semiconductor device constituting the CPU is required to operate at an even higher speed as compared with the semiconductor device constituting the peripheral driving circuits. Therefore, according to the technique disclosed in Japanese Patent Application 5-218156, the mobility in the TFT is not satisfactory. Thus, the CPU cannot be formed on an active-matrix substrate on which an active-matrix region is formed. This explains why an IC chip formed using a single crystalline silicon substrate is conventionally mounted on an active-matrix substrate.

Accordingly, if a crystalline silicon film having a mobility substantially equal to a mobility of a single crystalline silicon could be formed on a transparent insulating substrate made of glass, etc., then not only the performance of the peripheral driving circuits for driving an active-matrix region might be remarkably improved, but also a liquid crystal display device including a display, a CPU, memories and the like might be formed, and in addition, the liquid crystal display device might function as an image sensor, a touch operator, and the like.

SUMMARY OF THE INVENTION

The semiconductor device of the invention includes an active region made of a crystalline silicon film on an insulating surface of a substrate. In the semiconductor device, the active region is formed by introducing at least one kind of catalyst elements for promoting a crystallization into a first amorphous silicon film; heating the first amorphous silicon film so as to grow needle-like or column-like crystals; and crystallizing a second amorphous silicon film using the needle-like or column-like crystals as seed crystals.

In one embodiment, a thickness of the needle-like or column-like crystals used as the seed crystals is 100 nm or less.

In another embodiment, the second amorphous silicon film is crystallized by irradiating a laser beam or an intense light.

In still another embodiment, at least one kind of catalyst elements are selected from a group consisting of Ni, Co, Pd, Pt, Cu, Ag, Au, In, Sn, Al, P, As and Sb.

According to another aspect of the invention, a method for producing a semiconductor device including an active region made of a crystalline silicon film on an insulating surface of a substrate is provided. The method includes the steps of: forming a first amorphous silicon film over the substrate; introducing at least one kind of catalyst elements for promoting the crystallization into a selected portion of the first amorphous silicon film; first annealing the first amorphous silicon film so as to crystallize the selected portion of the first amorphous silicon film, and then to form a laterally grown crystalline portion of the first amorphous silicon film which extends from the selected portion of the first amorphous silicon film in a direction substantially parallel to the insulating surface of the substrate; forming an insulating thin film over the laterally grown crystalline portion of the first amorphous silicon film; partially removing the insulating thin film and the laterally grown crystalline portion of the first amorphous silicon film so that a linear boundary is formed along the crystal-growing direction; forming a second amorphous silicon film over the substrate; and second annealing the second amorphous silicon film so as to crystalize the second amorphous silicon film using the linear boundary as a seed for crystal growth.

According to still another aspect of the invention, a method for producing a semiconductor device including an active region made of a crystalline silicon film on an insulating surface of a substrate is provided. The method includes the steps of: forming a first amorphous silicon film over the substrate; introducing at least one kind of catalyst elements for promoting the crystallization into a selected portion of the first amorphous silicon film; first annealing the first amorphous silicon film so as to crystallize the selected portion of the first amorphous silicon film, and then to form a laterally grown crystalline portion of the first amorphous silicon film which extends from the selected portion of the first amorphous silicon film in a direction substantially parallel to the insulating surface of the substrate; patterning the laterally grown crystalline portion of the first amorphous silicon, so as to form a island-shape silicon region which extends along the crystal-growing direction; forming a second amorphous silicon film over the island-shape silicon region; and second annealing the second amorphous silicon film so as to crystalize the second amorphous silicon film using the island-shape silicon region as a seed for crystal growth.

According to still another aspect of the invention, a method for producing a semiconductor device including an active region made of a crystalline silicon film on an insulating surface of a substrate is provided. The method includes the steps of: forming a first amorphous silicon film over the substrate; introducing at least one kind of catalyst elements for promoting the crystallization into a selected portion of the first amorphous silicon film; first annealing the first amorphous silicon film so as to crystallize the selected portion of the first amorphous silicon film, and then to form a laterally grown crystalline portion of the first amorphous silicon film which extends from the selected portion of the first amorphous silicon film in a direction substantially parallel to the insulating surface of the substrate; forming an insulating thin film over the laterally grown crystalline portion of the first amorphous silicon film; forming an opening in the insulating thin film so as to expose a selected area of a top surface of the laterally grown crystalline portion of the first amorphous silicon film, the opening extending linearly along the crystal-growing direction; forming a second amorphous silicon film over the insulating thin film, and second annealing the second amorphous silicon film so as to crystalize the second amorphous silicon film using the selected area of the top surface of the laterally grown crystalline portion of the first amorphous silicon film as a seed for crystal growth.

According to still another aspect of the invention, a method for producing a semiconductor device including an active region made of a crystalline silicon film on an insulating surface of a substrate is provided. The method includes the steps of: forming a first amorphous silicon film over the substrate; patterning the first amorphous silicon film to form an island-shape silicon region; introducing at least one kind of catalyst elements for promoting the crystallization into a selected portion of the island-shape silicon region; first annealing the island-shape silicon region so as to crystalize the selected portion of the island-shape silicon region, and then to form a laterally grown crystalline portion of the island-shape silicon region which extends from the selected portion of the island-shape silicon region in a direction substantially parallel to the insulating surface of the substrate; forming a second amorphous silicon film on the island-shape silicon region; and second annealing the second amorphous silicon film so as to crystalize the second amorphous silicon film using the island-shape silicon region as a seed for crystal growth.

In one embodiment, a width of the selected area of the top surface of the laterally grown crystalline portion of the first amorphous silicon film is 200 nm or less.

In still another embodiment, a width of the island-shape silicon region is 200 nm or less.

In still another embodiment, the catalyst elements are selected from the group consisting of Ni, Co, Pd, Pt, Cu, Ag, Au, In, Sn, Al, P, As, and Sb.

In still another embodiment, the substrate is made of glass having a distortion point of 700° C. or less, and a crystallinity of the active region is substantially equal to a crystallinity of a single crystal.

In still another embodiment, the semiconductor device further includes a central processing unit formed on the substrate. The central processing unit includes a thin-film transistor including at least a part of the active region.

In still another embodiment, the distortion point of the glass is 650° C. or less.

In still another embodiment, the active region has a field-effect mobility of 200 cm$^2$/Vs or more with respect to electrons.

In still another embodiment, the active region has a field-effect mobility of 150 cm$^2$/Vs or more with respect to holes.

According to still another aspect of the invention, a method for producing a semiconductor device is provided. The method includes the steps of: forming a first amorphous silicon film over an insulating surface of a substrate; introducing at least one catalyst element for promoting the crystallization into a selected portion of the first amorphous silicon film; first annealing the first amorphous silicon film so as to crystallize the selected portion of the first amorphous silicon film, and then to form a laterally grown crystalline portion of the first amorphous silicon film; forming a second amorphous silicon film so as to contact with a selected area of the laterally grown crystalline portion of the first amorphous silicon film; second annealing the second amorphous silicon film so as to crystallize the second amorphous silicon film using the selected area of the laterally grown crystalline portion of the first amorphous silicon film as a seed for crystal growth.

According to a method of the present invention, catalyst elements are introduced into an amorphous silicon film formed on a substrate having an insulating surface; and then the film is heated, thereby growing needle-like or column-like crystals by using the introduced catalyst elements as the nuclei. A substrate having an insulating surface herein includes not only an insulating substrate such as a glass substrate, but also a substrate whose surface is covered with an insulating film, without regard to the insulation properties of the substrate. Each of the needle-like or column-like crystals is a satisfactorily crystallized single crystal. Therefore, in the case of crystal-growing an amorphous silicon film by using these crystals as seed crystals, a crystalline silicon film having the crystallinity almost as excellent as that of a single crystal may be obtained. If a semiconductor device is fabricated by using a crystalline silicon film having such satisfactory crystallinity as the active region, then a high-mobility device may be produced on a substrate made of glass, etc., having an insulating surface, which has not been realized by conventional techniques.

During crystal-growth, the crystal orientation of the needle-like or column-like crystal rotates relative to an axis defined by the crystal-growing direction thereof. The width of each needle-like or column-like crystal is approximately 100 nm. In the case where the thickness of the starting film (an amorphous silicon film) is 100 nm or less, the rotation of the crystal orientation is suppressed and the width of each crystal becomes larger, so that even more satisfactory crystallinity may be obtained. Accordingly, the film thickness of the first amorphous silicon film is preferably 100 nm or less. According to the results of the experiments conducted by the present inventors, it is confirmed that if the thickness of the starting amorphous silicon film is 50 nm, then the film thickness of each needle-like or column-like crystal is also 50 nm; and that the width of each needle-like or column-like crystal is enlarged to the range of 150 to 200 nm.

In the case of crystallizing an amorphous silicon film using the needle-like or column-like crystals as the seed crystals, satisfactory effects may be attained by conducting a heat treatment alone. However, if the amorphous silicon film is heated while being irradiated with a laser beam or an intense light, then a crystalline silicon film exhibiting a crystallinity almost as excellent as that of the seed crystals may be obtained.

In the case of employing Ni, which is preferable, as the catalyst element, a remarkable effect may be obtained. Alternatively, one or more of Co, Pd, Pt, Cu, Ag, Au, In, Sn, P, As and Sb may also be employed. If one or a plurality of catalyst element(s) selected from the above-cited elements is/are introduced, even a very small amount (on the order of $1 \times 10^{18}$ cm$^{-1}$) of such catalyst elements promotes the crystallization. Therefore, such elements do not adversely affect the resultant semiconductor device.

According to a first method of the present invention for producing such a semiconductor device, the catalyst elements for promoting the crystallization are selectively introduced into a first amorphous silicon film, and then the first amorphous silicon film is crystallized by heating, so that the crystals are grown in a direction substantially parallel to the surface of the substrate in a region surrounding the region into which the catalyst elements are selectively introduced, thereby growing needle-like or column-like crystals. Next, an insulating thin film is formed on these needle-like or column-like crystals; then the insulating thin film and the crystalline silicon film are partially removed so that a linear boundary is formed along the crystal-growing direction of the crystalline silicon film; and then a second amorphous silicon film is formed thereon. Thereafter, the second amorphous silicon film is crystallized by heating the film or by irradiating the film with a laser beam or an intense light, so that the crystals are grown by using the needle-like or column-like crystals as seed crystals. As a result, a crystalline silicon film exhibiting a crystallinity almost as excellent as that of a single crystal may be obtained.

According to a second method of the present invention, the needle-like or column-like crystals grown in the direction substantially parallel to the surface of the substrate are linearly patterned, and then a second amorphous silicon film is formed thereon. Thereafter, the second amorphous silicon film is crystallized by heating the film or by irradiating the film with a laser beam or an intense light while using the needle-like or column-like crystals as the seed crystals. The line width of the linearly patterned crystalline silicon is preferably equal to the width of the needle-like or column-like crystals to be used as the seed crystals or less, specifically, 200 nm or less.

According to a third method of the present invention, the insulating thin film formed on the needle-like or column-like crystals is removed linearly along the crystal-growing direction of the crystalline silicon film, and a second amorphous silicon film is formed thereon. Thereafter, the second amorphous silicon film is crystallized by heating the film or by irradiating the film with a laser beam or an intense light by using the needle-like or column-like crystals as seed crystals. The line width of the linearly removed insulating thin film is preferably equal to or less than the width of the needle-like or column-like crystals to be used as the seed crystals, specifically, 200 nm or less.

According to a fourth method of the present invention, a first amorphous silicon film is linearly formed on the substrate, and then the catalyst elements for promoting crystallization are selectively introduced into a portion of the first amorphous silicon film. Next, the first amorphous silicon film is crystallized by heating the film, so that the crystals are grown along the linear pattern of the first amorphous silicon film in the direction substantially parallel to the surface of the substrate from the region into which the catalyst elements are selectively introduced, thereby obtaining the needle-like or column-like crystals. Subsequently, a second amorphous silicon film is formed on the needle-like or column-like crystals, and then heated or irradiated with a laser beam or an intense light, so that the second amorphous silicon film is crystallized by using the needle-like or column-like crystals as seed crystals. The line width of the linear crystalline silicon obtained by crystallizing the first amorphous silicon film is preferably 200 nm or less so that a single crystalline state without any grain boundaries is obtained.

Thus, the invention described herein makes possible the advantage of providing a semiconductor device in which a crystalline silicon film having a mobility substantially equal to that of single crystalline silicon is formed on a substrate; and a method for producing such a device.

This and other advantages of the present invention will become apparent to those skilled in the art upon reading and understanding the following detailed description with reference to the accompanying figures.

BRIEF DESCRIPTION OF THE DRAWINGS

FIGS. 8A to 8D are cross-sectional views schematically showing the production steps of a semiconductor device according to the second example of the present invention.

FIG. 9 is a plan view showing a production process of a crystalline silicon film in a semiconductor device according to a third example of the present invention.

DESCRIPTION OF THE PREFERRED EMBODIMENTS

Hereinafter, the present invention will be described by way of illustrative examples with reference to the accompanying figures. It is noted that the TFTs to be obtained by the methods described in the following examples may be used as a device in which a CPU is formed on one and the same substrate, as well as the drivers and the pixel portions of an active-matrix liquid crystal display device. In addition, the TFTs are applicable not only to a liquid crystal display device, but also to all kinds of semiconductor devices which are generally called "thin-film integrated circuits".

EXAMPLE 1

In Example 1, the present invention will be described as being applied to an N-type TFT formed on a glass substrate.

Figure 1:
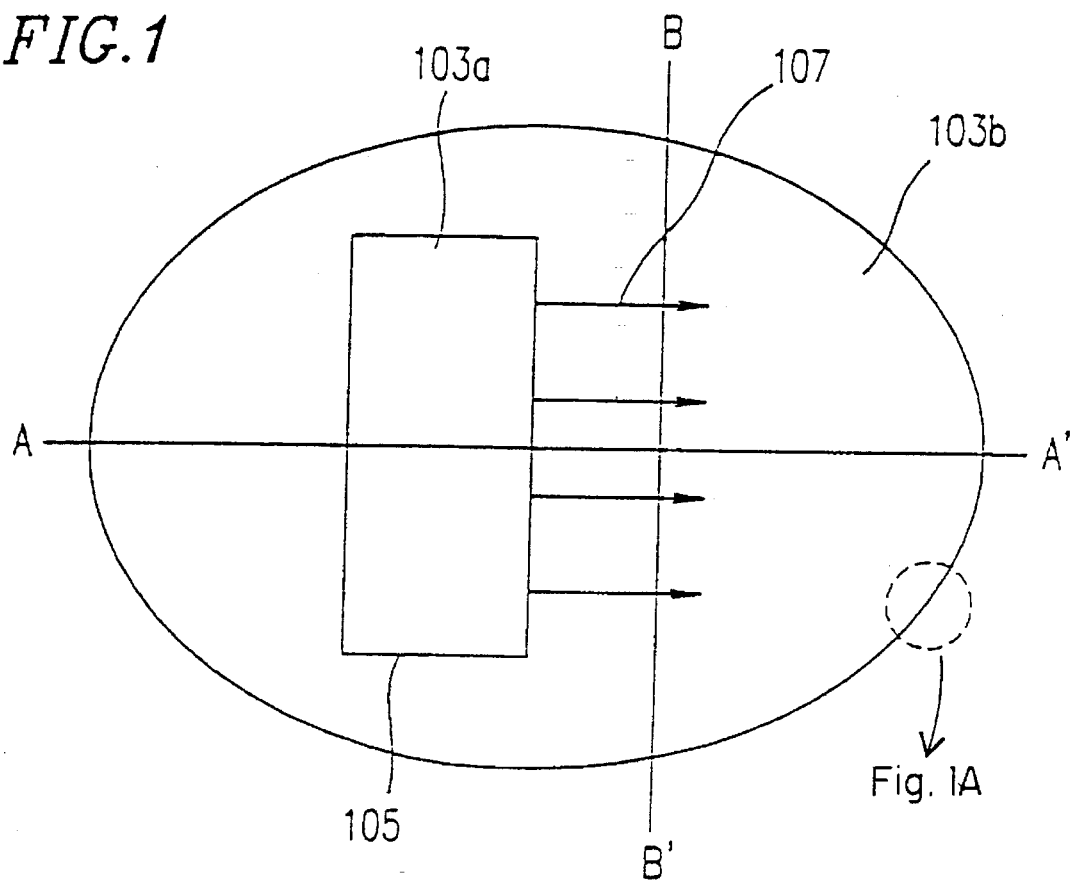
FIG. 1 is a plan view showing a production process of a crystalline silicon film in a semiconductor device according to a first example of the present invention.
Figure 1A:
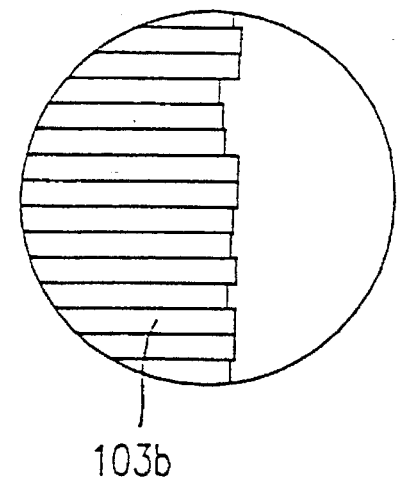

FIG. 1 is a plan view showing the production process of a crystalline silicon film. FIGS. 2A to 2D are cross-sectional views taken along the line A-A' in FIG. 1. FIGS. 3A to 3E are cross-sectional views taken along the line B-B' in FIG. 1. The production steps proceed sequentially in the order of these FIGS. 2A to 2D and FIGS. 3A to 3E. FIGS. 4A to 4D are cross-sectional views showing the production steps to be conducted after the production step shown in FIG. 3E.

Figure 4A:
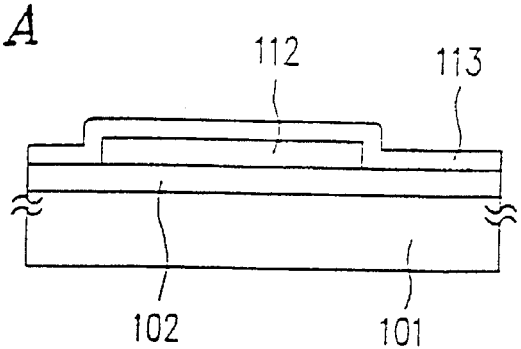
FIGS. 4A to 4D are cross-sectional views schematically showing the production steps of a semiconductor device according to the first example of the present invention.
Figure 4B:
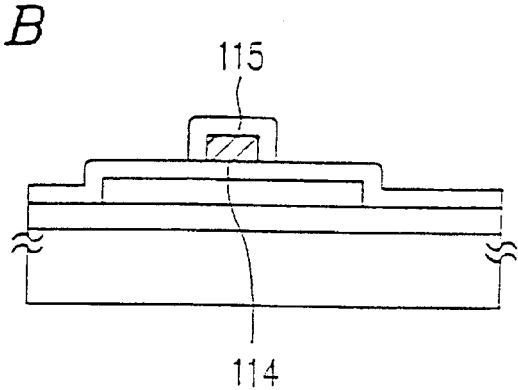
Figure 4C:
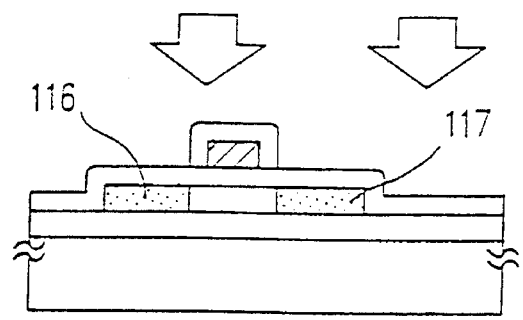
Figure 4D:
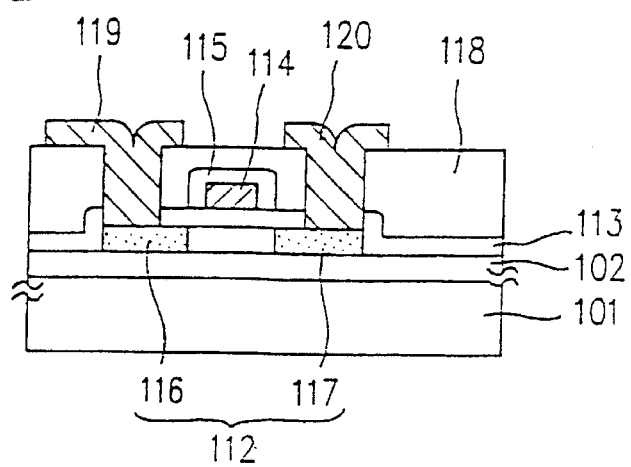

FIG. 4D shows a cross section of a TFT to be obtained according to the first example of the invention. In this TFT, an underlying film 102 made of silicon oxide is formed on a glass substrate 101 in order to prevent the diffusion of the impurities from the substrate 101; an active region 112, made of crystalline silicon, including a source region 116, a drain region 117 and a channel region is formed on the underlying film 102; and a gate insulating film 113 made of silicon oxide is formed on the regions.

In all of the examples of the present invention, a relatively inexpensive glass substrate having a distortion point of 700° C. or less, borosilicate glass such as Corning 1733, 1734 or 1737, may be used as the glass substrate 101. Alternatively, a glass substrate having a distortion point of 600° C. or less, borosilicate glass such as e.g., borosilicate glass such as Corning 7059, may also be used. The processing temperatures during the respective steps to be described later are preferably lower than the distortion point of the glass substrate to be used by approximately 50° C.

A gate electrode 114 made of an aluminum film or the like is formed over the gate insulating film 113 so as to face the channel region; the surface of the gate electrode 114 is covered with an oxide layer 115 obtained by anodically (or positively) oxidizing the gate electrode 114. An interlayer insulating film 118, made of silicon oxide or silicon nitride, is formed so as to cover the oxide layer 115; and electrode lines 119 and 120 for a TFT, constituted by a multi-layered film composed of a metal material such as titanium nitride and aluminum, are superposed on the interlayer insulating film 118. These electrode lines 119 and 120 are electrically connected to the source region 116 and the drain region 117 via the contact holes formed in the gate insulating film 113 and the interlayer insulating film 118.

The TFT having the construction described above may be produced, for example, in the following manner. First, referring to FIG. 1 through FIG. 3E, the production steps of the TFT will be described below wherein the crystalline silicon film for constituting the active region of the TFT is produced.

Figure 2A:
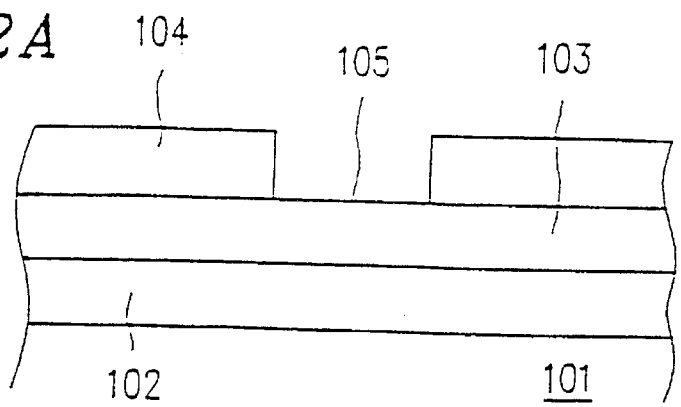
FIGS. 2A to 2D are cross-sectional views taken along the line A-A' in FIG. 1.

First, as shown in FIG. 2A, an underlying film 102 made of silicon oxide having a thickness of about 200 nm is formed on the glass substrate 101 by a sputtering technique or the like. A first intrinsic (type I) amorphous silicon film 103 having a thickness of 80 nm is deposited by a low-pressure CVD method or a plasma CVD method on the underlying film 102. The thickness of the amorphous silicon film 103 may be in the range of 25 to 100 nm.

Next, a mask 104 having a thickness of about 50 nm is formed on the amorphous silicon film 103 using an insulating thin film made of silicon oxide, silicon nitride, or the like, and then the mask 104 is selectively removed so as to form a window 105 for introducing catalyst elements. If the film under this state is seen from above the upper surface of the substrate, a portion of the first amorphous silicon film 103 is exposed through the window 105, while the remaining portion is still masked.

Figure 2B:
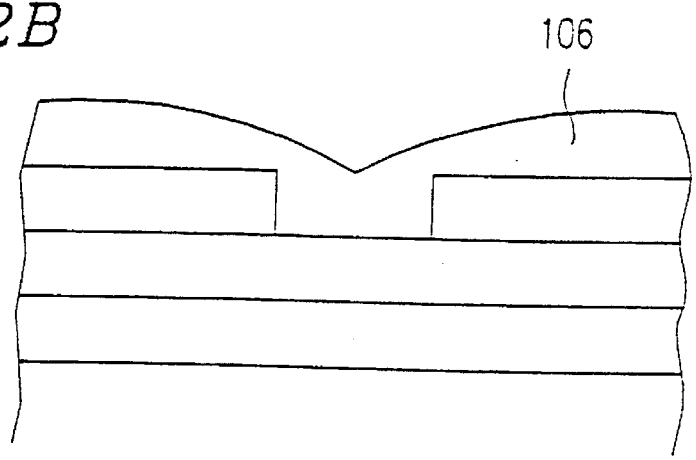
Figure 2C:
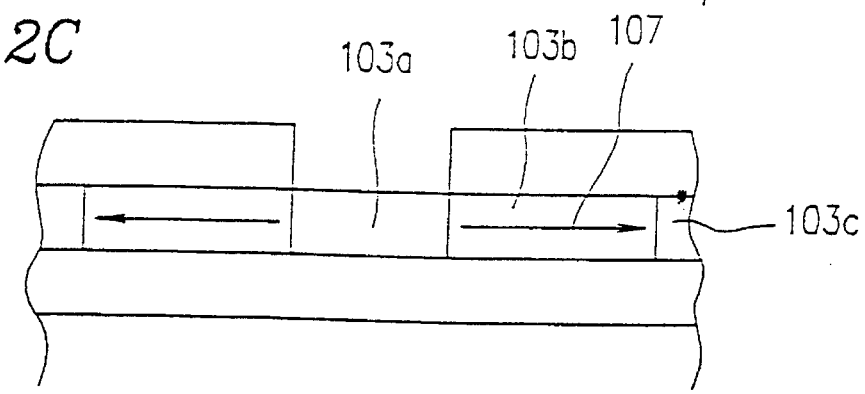

Subsequently, as shown in FIG. 2B, a nickel-salt aqueous solution 106 containing nickel acetate or nickel nitrate is applied to the entire surface of the substrate, and then the surface of the substrate is uniformly dried by using a spinner. The nickel concentration in this aqueous solution 106 is suitably in the range of 50 to 200 ppm, more preferably 100 ppm. In this case, since the Ni ions in the aqueous solution 106 are in contact with the portion of the amorphous silicon film 103 defined by the window 105, a very small amount (on the order of $1 \times 10^{18}$ cm$^{-3}$) of Ni is locally added.

Then, the portion of the amorphous silicon film 103 is annealed at a temperature of 520° to 580° C. for several hours to several tens of hours, e.g., at 550° C. for 16 hours, under hydrogen-reduction atmosphere (the partial pressure of hydrogen is preferably in the range of 0.1 to 1 atmospheres of pressure) or under an inert atmosphere (atmospheric pressure), so as to be crystallized. In this case, the first amorphous silicon film 103 is crystallized in a direction vertical to the substrate 101 in the portion of the amorphous silicon film 103 (defined by the window 105) into which a very small amount of nickel is locally added, so that a crystalline silicon film 103a is formed. On the other hand, in the region surrounding the window 105, the crystal is grown from the portion of the amorphous silicon film 103 (defined by the window 105) in a lateral direction (i.e., the direction parallel to the substrate 101) as indicated by the arrows 107 in FIG. 2C, so that the crystalline silicon film 103b is grown laterally. In the other regions, the amorphous silicon film 103 remains the same as denoted by 103c. During the crystal growth described above, the length of crystal growth in the direction parallel to the substrate 101 as indicated by the arrows 107 is approximately 80 μm.

Figure 2D:
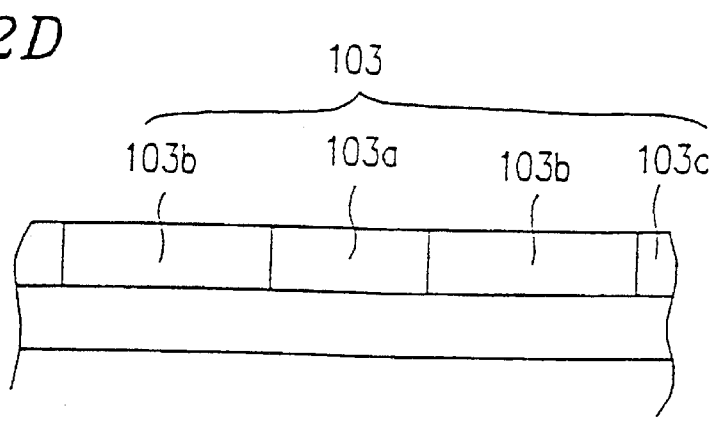

After that, as shown in FIG. 2D, the mask 104 is removed. In this case, FIGS. 2C and 2D correspond to the cross section taken along the line A-A' in FIG. 1.

Figure 3A:
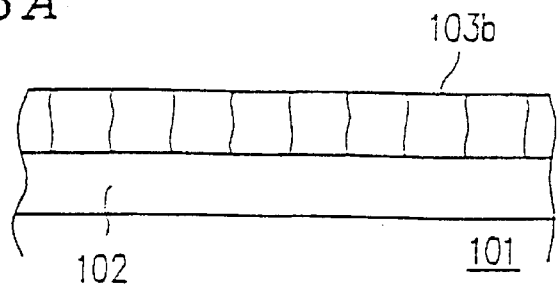
FIGS. 3A to 3E are cross-sectional views taken along the line B-B' in FIG. 1.

An enlarged plan of the extremity of the crystal growing portion of the crystalline silicon film 103b growing laterally is shown inside the circle drawn in the lower part of FIG. 1. The crystalline silicon film 103b consists of needle-like or column-like crystals orderly extending along the crystal-growing direction. The width of each needle-like or column-like crystal is in the range of 80 to 100 nm in the case of seeing the crystal from above the upper surface of the film (if the thickness of the starting amorphous silicon film 103 is 80 nm). If the thickness of the starting amorphous silicon film 103 is set to be 50 nm, then the width of each needle-like or column-like crystal may be enlarged to the range of 150 to 200 nm. On the other hand, if the crystalline silicon film 103b is seen from the cross section taken along the line B-B' in FIG. 1, there is no grain boundary between the top and the bottom of the crystalline silicon film 103b as shown in FIG. 3A.

Figure 3B:
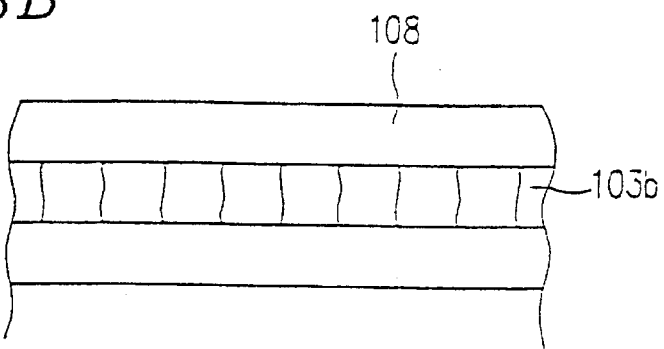

Next, as shown in FIG. 3B, an insulating thin film 108 made of silicon oxide or silicon nitride having thickness in the range of 10 to 100 nm, e.g., 20 nm, is provided on the silicon film 103 including crystalline silicon film regions 103a and 103b and an amorphous silicon film region 103c.

Figure 3C:
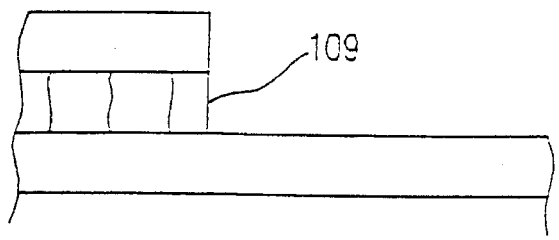

Then, as shown in FIG. 3C, the insulating thin film 108 and the crystalline silicon film 103b are partially removed by an etching technique or the like so that a linear border is formed along the crystal growing direction 107 (e.g., a direction along the line A-A' in FIG. 1) of the crystalline silicon film 103b growing laterally. As a result, a side of the crystalline silicon film 103b is exposed along the etching line. In such a state, the crystal 109 on the exposed side of the crystalline silicon film 103b is a side of one needle-like or column-like crystal having almost no grain boundaries, so that the side exhibits almost as excellent state as that of a single crystal.

Figure 3D:
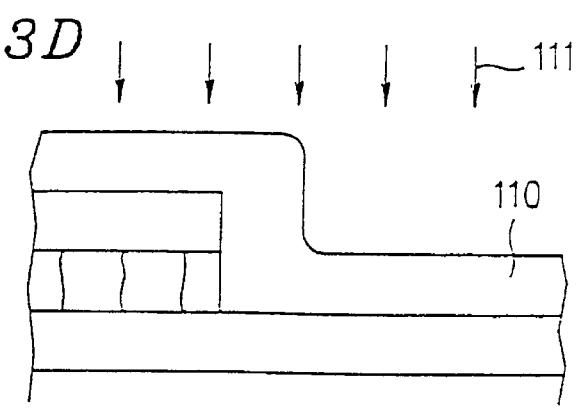

Subsequently, as shown in FIG. 3D, a second amorphous silicon film 110 having a thickness of about 100 nm is deposited thereon by a low-pressure CVD method or a plasma CVD method, and then the film 110 is irradiated with a laser beam 111. The thickness of the second amorphous silicon film 110 may be in the range of 50 to 200 nm. The second amorphous silicon film 110 is crystallized by using the needle-like or column-like crystals 109 as the seed crystals by laser irradiation, so as to form a crystalline silicon film 110. In this example, a KrF excimer laser (wavelength: 248 nm; pulse width; 20 nsec) is used as the laser beam 111, alternatively other kinds of laser beams may also be used. The irradiation conditions are defined as follows: the energy density is set to be in the range of 200 to 400 mJ/cm$^2$, e.g., 300 mJ/cm$^2$, and several shots of laser are irradiated on a point. In the case where the substrate is heated at a temperature of 200° to 400° C. during the laser irradiation, then the effects may be further improved.

Figure 3E:
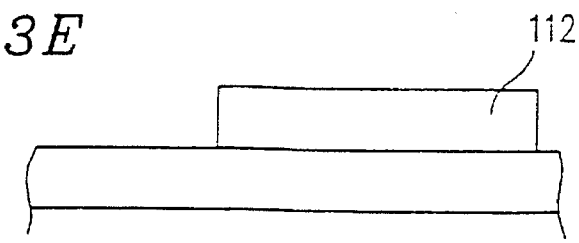

And then, as shown in FIG. 3E, all the regions of the crystalline silicon film 110, except for the region to be used as an active region (element region) 112 for each TFT, are removed by an etching technique, thereby isolating the respective TFTs to be formed. The crystalline silicon film region 112 fabricated in the above-described manner exhibits a crystallinity almost as excellent as that of a single crystalline silicon. According to the method of the present invention, a crystalline silicon film of an excellent quality, which could not be obtained according to any conventional method, may be fabricated on a glass substrate.

Hereinafter, referring to FIGS. 4A to 4D, the steps for producing an N-type TFT by using a crystalline silicon film thus fabricated will be described in detail below.

First, as shown in FIG. 4A, a gate insulating film 113 made of silicon oxide having a thickness of 20 to 150 nm, e.g., 100 nm, is deposited so as to cover the crystalline silicon film 112 to be used as an active region. This gate insulating film 113 is formed by dissolving a source material (TEOS in this example) mixed with oxygen using an RF plasma CVD method (substrate temperature: 150° to 600° C., more preferably 300° to 450° C.). Alternatively, this gate insulating film 113 may also be formed by dissolving TEOS mixed with ozone gas by a low-pressure plasma CVD method or an atmospheric-pressure CVD method (substrate temperature: 350° to 600° C., more preferably 400° to 550° C.).

After the deposition of the gate insulating film 113, in order to improve the bulk characteristics of the gate insulating film 113 itself and the interface characteristics between the crystalline silicon film 112 and the gate insulating film 113, the film 113 is annealed at 400° to 600° C. for 30 to 60 minutes under an inert ambient gas.

Subsequently, an aluminum film having a thickness of 400 to 800 nm, e.g., 600 nm, is deposited on the gate insulating film 113 by a sputtering technique. Then, as shown in FIG. 4B, the aluminum film is patterned so as to form a gate electrode 114, and then the surface of the gate electrode 114 is anodically oxidized so as to form an oxide layer 115 on the surface thereof. This anodically oxidization was conducted in an ethyleneglycol solution containing tartaric acid (1 to 5%); the reaction was conducted by supplying a constant current initially so as to increase the voltage up to 220 V, and by maintaining the state for an hour. The thickness of the resulting oxide layer 115 was 200 nm. The thickness of the oxide layer 115 determines the length of the offset gate region to be formed during a subsequent ion doping step. In addition, the formation of this oxide layer 115 prevents the formation of hillock on the aluminum film constituting the gate electrode 114 during subsequent steps.

Next, impurities (phosphorus ions) are implanted into the active region 112 by an ion doping method using the gate electrode 114 and the oxide layer 115 covering the gate electrode 114 as a mask. This implantation is conducted under the following conditions: phosphine (PH$_3$) is used as a doping gas; the accelerating voltage is set to be 60 to 90 kV, e.g., 80 kV; the implant dose is set to be 1×10$^{15}$ to 8×10$^{15}$ cm$^{-2}$, e.g., 2×10$^{15}$ cm$^{-2}$. The regions 116 and 117 into which the impurities are implanted during this step will be used as the source and the drain regions of a TFT, while the region into which no impurities are implanted being masked by the gate electrode 114 and oxide layer 115 will be used as the channel region of a TFT.

Thereafter, as shown in FIG. 4C, annealing is conducted by laser beam irradiation thereby activating the implanted impurities, and at the same time, improving the crystallinity of the regions which has been degraded by the impurity implantation. In this example, a XeCl excimer laser (wavelength: 308 nm; pulse width: 40 nsec) is used as a laser beam. The irradiation condition is determined as follows. The energy density is in the range of 150 to 400 mJ/cm$^2$, more preferably in the range of 200 to 250 mJ/cm$^2$. The sheet resistance of the N-type impurity (phosphorus) regions 116 and 117 thus formed is in the range of 200 to 800 Ω/□. Alternatively, other kinds of laser beams may also be used.

Then, as shown in FIG. 4D, an interlayer insulating film 118 made of silicon oxide or silicon nitride having a thickness of about 6000 Å is formed by a plasma CVD method, or the like. In the case of forming a silicon oxide film, if the silicon oxide film is formed by a method for dissolving TEOS with oxygen by the RF plasma CVD, or by a method for dissolving TEOS with ozone gas by the low-pressure plasma CVD or by the ambient pressure CVD, then a satisfactory interlayer insulating film excellent in the step coverage may be obtained. In the case of forming the silicon nitride film, if the film is deposited by the plasma CVD method using $SiH_4$ and $NH_3$ as source gases, then hydrogen may be supplied to the interfaces between the active region and the gate insulating film and the dangling bonds in the crystalline silicon film can be terminated with hydrogen, thereby improving the characteristics of the TFT.

Next, the contact holes are formed in the interlayer insulating film 118, and the electrode lines 119 and 120 are formed using the multi-layered film composed of a metal material such as titanium nitride and aluminum so as to be connected to the source and the drain regions 116 and 117. The multi-layered film is constructed by stacking an aluminum film on a titanium nitride film. In all the examples of the invention, the titanium nitride film may serve as a barrier film for preventing the diffusion of aluminum into a semiconductor layer.

Finally, annealing is conducted at 350° C. for 30 minutes under a hydrogen atmosphere at one atmosphere of pressure, thereby completing the TFT.

The TFT thus obtained may be used as the switching element for the pixel portions and the peripheral driver circuits of an active-matrix liquid crystal display device or for integrated circuits including a CPU. In the case where the TFT is used as a switching element for a pixel electrode, one of the electrodes 119 and 120 is connected to the pixel electrode made of a transparent conductive film made of a material such as indium tin oxide (ITO), and the signal is input from the other electrode 119 or 120. In the case where the TFT is used for an integrated circuit such as a CPU, contact holes are formed also on the gate electrode 114, and after the necessary interconnection lines are formed, the gate electrode 114 is connected to the lines.

In the N-type TFT thus obtained, since the active region 112 is made of a crystalline silicon film having a crystallinity almost as excellent as single crystalline silicon, the resulting field-effect mobility is very high, i.e., 200 to 300 $cm_2$/Vs or more.

In general, a carrier mobility in an active region under a thin-film state cannot be simply compared with a carrier mobility in a single crystalline silicon substrate. However, in this specification, when the field-effect mobility of the electrons is 200 $cm^2$/Vs or more, the crystallinity of the active region is regarded to be "substantially equal to" the crystallinity of single crystalline silicon. On the other hand, when the field-effect mobility of the holes is 150 $cm^2$/Vs or more, the crystallinity of the active region is regarded to be "substantially equal to" the crystallinity of single crystalline silicon.

In the case where a CPU is formed using an N-type TFT of this example, the field-effect mobility in the active region 112 is preferably 250 $cm^2$/Vs or more.

EXAMPLE 2

In Example 2, the present invention will be described as being applied to a circuit under a CMOS structure including an N-type TFT and a P-type TFT complementarily on a glass substrate.

Figure 5:
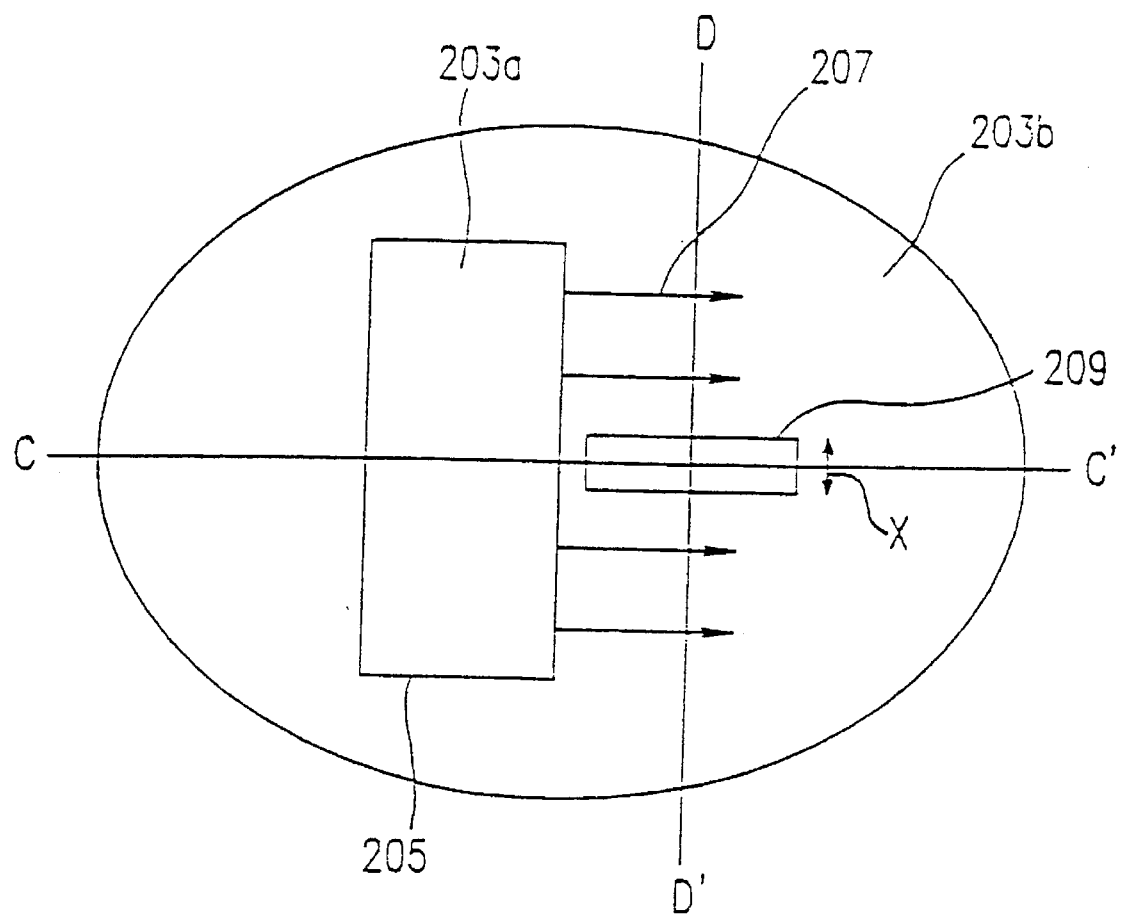
FIG. 5 is a plan view showing a production process of a crystalline silicon film in a semiconductor device according to a second example of the present invention.

FIG. 5 is a plan view showing the production process of a crystalline silicon film. FIGS. 6A to 6D are cross-sectional views taken along the line C-C' in FIG. 5. FIGS. 7A to 7E are cross-sectional views taken along the line D-D' in FIG. 5. The production steps proceed in the order of these FIGS. 6A to 6D and FIGS. 7A to 7E. FIGS. 8A to 8D are cross-sectional views showing the steps for producing a circuit under a CMOS structure, which sequentially proceeds in the order of these FIGS. 8A to 8D.

FIG. 8D shows a cross section of a circuit under the CMOS structure according to the second example of the invention. In this circuit, an underlying film 202 made of silicon oxide is formed on a glass substrate 201 in order to prevent the diffusion of the impurities from the substrate 201; an active region 212 for an N-type TFT, made of crystalline silicon, including a source region 217, a drain region 218 and a channel region, and an active region 213 for a P-type TFT, made of crystalline silicon, including a source region 219, a drain region 220 and a channel region are formed on the underlying film 202.

A gate insulating film 214 made of silicon oxide is formed over the active regions 212 and 213 on the substrate 201. Gate electrodes 215 and 216 made of an aluminum film are formed over the gate insulating film 214 so as to face the channel regions of the respective TFTs; the surfaces of the gate electrodes 215 and 216 are covered with an interlayer insulating film 221 made of silicon oxide; and electrode lines 222, 223 and 224 for a TFT, constituted by a multi-layered film composed of a metal material such as titanium nitride and aluminum, are superposed on the interlayer insulating film 221. These electrode lines 222, 223 and 224 are electrically connected to the source regions 217 and 219 and the drain regions 218 and 220 via the contact holes formed in the gate insulating film 214 and the interlayer insulating film 221.

The circuit of the CMOS structure having the construction described above may be produced, for example, in the following manner. First, referring to FIG. 5 through FIG. 7E, the production steps of the circuit will be described below wherein the crystalline silicon film for constituting the active regions of the TFT is produced.

Figure 6A:
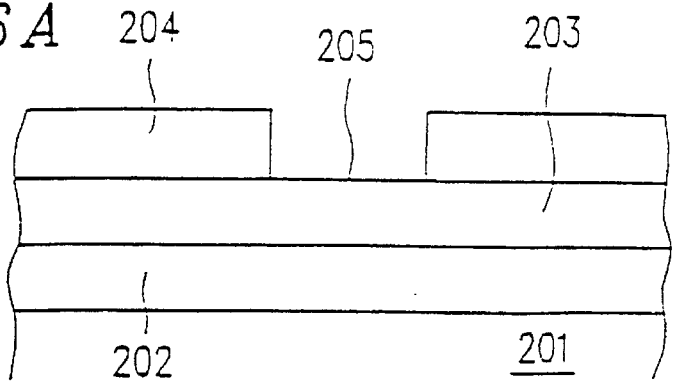
FIGS. 6A to 6D are cross-sectional views taken along the line C-C' in FIG. 5.

First, as shown in FIG. 6A, an underlying film 202 made of silicon oxide having a thickness of about 100 nm is formed on the glass substrate 201 by a sputtering technique or the like. A first intrinsic (type I) amorphous silicon film 203 having a thickness of 25 to 100 nm, e.g., 50 nm, is deposited using a low-pressure CVD method on the underlying film 202.

Next, a mask 204 having a thickness of about 50 nm is formed on the amorphous silicon film 203 using an insulating thin film made of silicon oxide, silicon nitride, or the like, and then the mask 204 is selectively removed so as to provide a window 205 for introducing catalyst elements. If the film under this state is seen from above the upper surface of the substrate, a portion of the first amorphous silicon film 203 is exposed through the window 205 while the remaining portion is still masked as shown in FIG. 5.

Figure 6B:
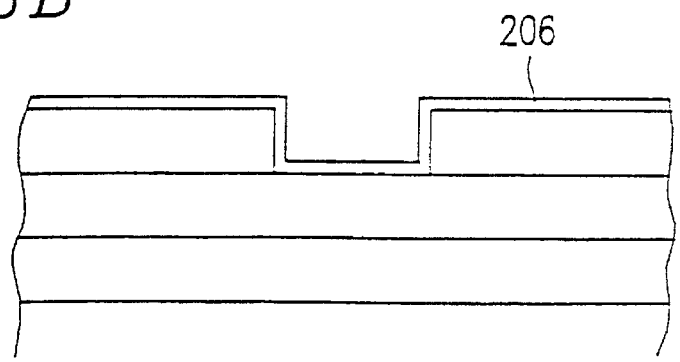
Figure 6C:
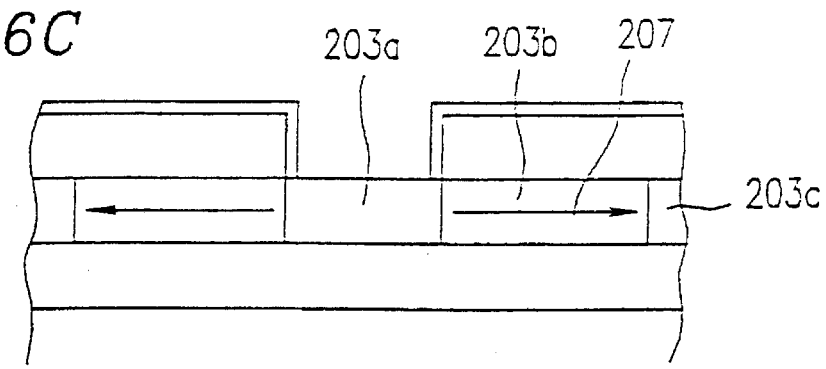

Subsequently, as shown in FIG. 6B, a nickel silicide film 206 ($NiSi_x$; where $0.4 \leq X \leq 2.5$, e.g., X=2.0) is deposited on the mask 204 by a sputtering technique or the like. The thickness of the nickel silicide film 206 is suitably in the range of 0.5 to 20 nm. As a result, a very small amount (on the order of $1 \times 10^{18}$ $cm^{-3}$) of nickel is locally added to the portion of the amorphous silicon film 203 defined by the window 205. Then, the portion of the amorphous silicon film 203 is annealed at a temperature of 550° C. for 16 hours under a hydrogen-reduction atmosphere or under an inert atmosphere so as to be crystallized.

Figure 6D:
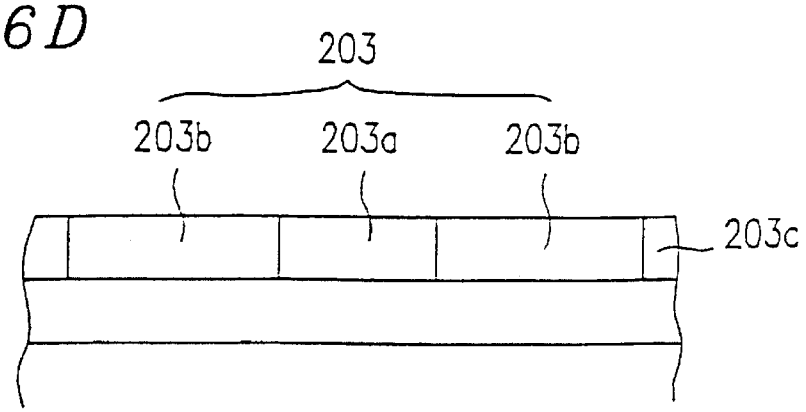

In this case, the first amorphous silicon film 203 is crystallized in a direction vertical to the substrate 201 in the portion of the amorphous silicon film 203 (defined by the window 205) into which a very small amount of nickel is locally added, so that a crystalline silicon film 203a is formed. On the other hand, in the regions surrounding the window 205, the crystal is grown from the portion of the crystalline silicon film 203a in a lateral direction (i.e., the direction parallel to the substrate 201) as indicated by the arrows 207 in FIG. 6C, so that the crystalline silicon film 203b is grown laterally. In the other regions, the amorphous silicon film 203c remains the same. During the crystal growth described above, the length of the crystal growth in the direction parallel to the substrate 201 as indicated by the arrows 207 is approximately 80 μm. After that, as shown in FIG. 6D, the mask 204 is removed. In this case, FIGS. 6C and 6D correspond to the cross section taken along the line C-C' in FIG. 5.

Figure 7A:
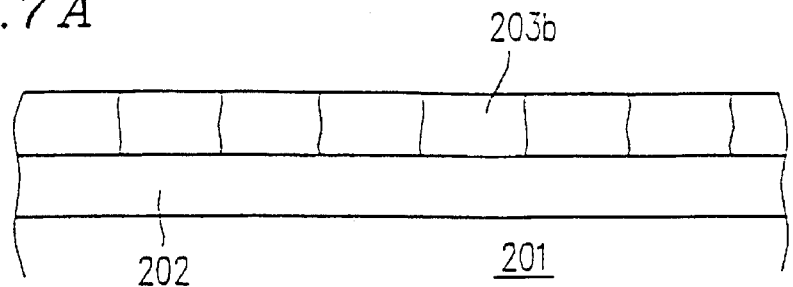
FIGS. 7A to 7E are cross-sectional views taken along the line D-D' in FIG. 5.

In the same way as in Example 1, the crystalline silicon film 203b grown laterally consists of needle-like or column-like crystals extending orderly along the crystal-growing direction. The width of each needle-like or column-like crystal is in the range of 150 to 200 nm in the case of seeing the crystal from above the upper surface of the film (if the thickness of the starting amorphous silicon film 203 is 80 nm). On the other hand, if the crystalline silicon film 203b is seen from the cross section taken along the line D-D' in FIG. 5, there is no grain boundary between the top and the bottom of the crystalline silicon film 203b, as shown in FIG. 7A.

Figure 7B:
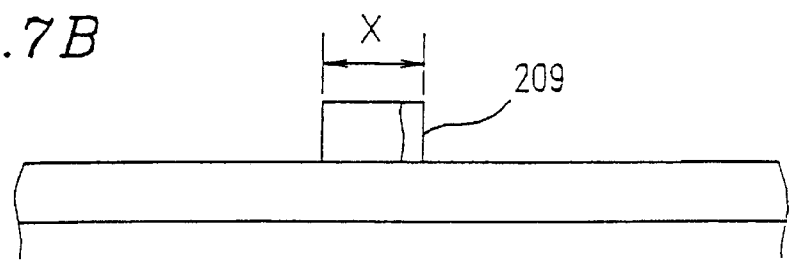

Next, as shown in FIG. 7B, the crystalline silicon film 203b grown laterally is linearly patterned along the crystal-growing direction, so that a long island-shaped crystalline silicon film 209 to be used as a seed crystal is formed. Seeing the island-shaped crystalline silicon film 209 from above the upper surface of the substrate 201, the island-shaped film 209 is found to be disposed as shown FIG. 5. In this case, if the line width X of the linear pattern is set to be equal to or less than the width of each needle-like or column-like crystal, more specifically 200 nm or less, then no grain boundary or only one grain boundary exists in the island-shaped crystalline silicon film 209, thereby realizing a crystallinity almost as excellent as that of a single crystal. On the other hand, if the line width X of the linear pattern is set to be more than 200 nm, then at least two needle-like or column-like crystals are arranged in the island-shaped crystalline silicon 209. However, even in such a case, one needle-like or column-like crystal is arranged on each side along the crystal-growing direction, i.e., the direction indicated by the line C-C' in FIG. 5. Therefore, in the case where the island-shaped crystalline silicon 209 is grown by using the two needle-like or column-like crystals as the seed crystals along the direction indicated by the line D-D' in FIG. 5, no particular problem occurs even if the grown crystals are used for the element regions. In this example, the island-shaped crystalline film 209 is formed with the line width X of the linear pattern set to be 200 nm.

Figure 7C:
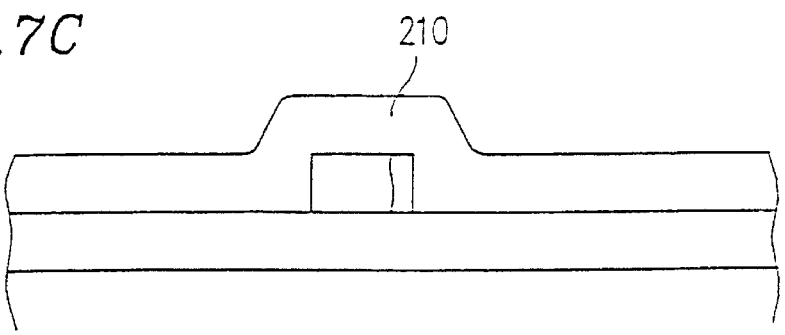

Subsequently, as shown in FIG. 7C, a second amorphous silicon film 210 having a thickness of about 100 nm is deposited on the island-shaped crystalline silicon film 209 by a low-pressure CVD method or the like. The thickness of the second amorphous silicon film 210 is suitably in the range of 50 to 200 nm.

Figure 7D:
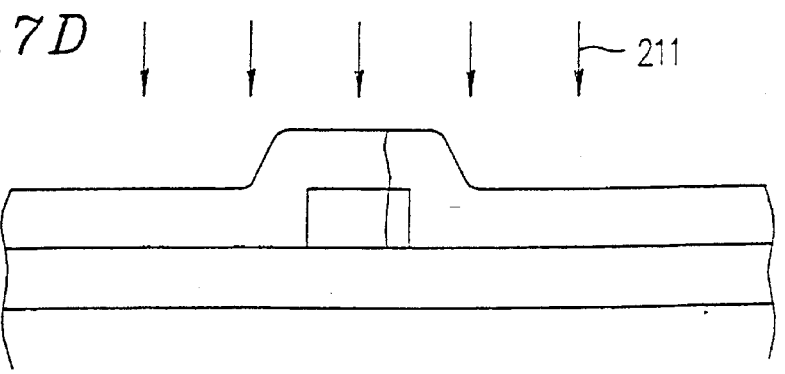

Then, as shown in FIG. 7D, the film 210 is irradiated with a laser beam 211. As a result, the second amorphous silicon film 210 is crystallized using the island-shaped crystalline silicon (or the needle-like or column-like crystal) 209 as the seed crystal, so as to form a crystalline silicon film 210. In this example, a XeCl excimer laser (wavelength: 308 nm; pulse width; 40 nsec) is used as the laser beam 211. The irradiation conditions are defined as follows: the substrate is heated at a temperature of 200° to 450° C. during the laser irradiation; and the energy density is set to be in the range of 200 to 400 mJ/cm$^2$.

Figure 7E:
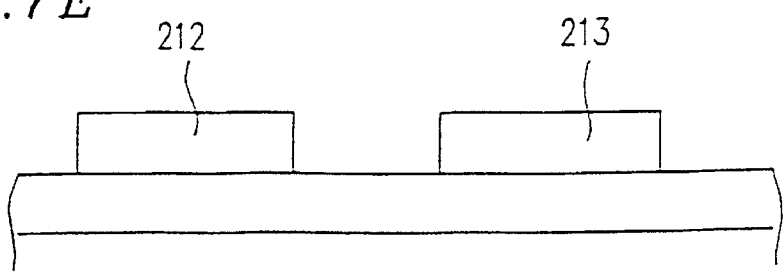

And then, as shown in FIG. 7E, all of the regions of the crystalline silicon film 210, except for the regions to be used as active regions (element regions) 212 and 213 for each TFT, are removed by an etching technique, thereby isolating the respective TFTs. The crystalline silicon film regions 212 and 213 fabricated in the above-described manner exhibit a crystallinity almost as excellent as that of a single crystalline silicon, thereby obtaining a high-quality crystalline silicon film.

Hereinafter, the steps for producing the circuit under the CMOS structure including an N-type TFT and a P-type TFT complimentarily by using the crystalline silicon film thus obtained will be described in detail below with reference to FIGS. 8A to 8D.

First, as shown in FIG. 8A, a gate insulating film 214 made of silicon oxide having a thickness of 100 nm is deposited so as to cover the crystalline silicon films 212 and 213 to be used as active regions. In this example, the gate insulating film 214 is formed by the sputtering technique. The sputtering is conducted under the following conditions: silicon oxide is used as a target; the substrate temperature is suitably in the range of 200° to 400° C., e.g., 350° C. in this example; the sputtering atmosphere is composed of oxygen and argon; and the ratio of argon to oxygen is suitably set to be in the range of 0 to 0.5, e.g., 0.1 or less in this example.

Subsequently, an aluminum film having a thickness of 600 nm is deposited on the gate insulating film 214 by a sputtering technique or the like. In this example, the thickness of the aluminum film is suitably in the range of 400 to 800 nm. Then, as shown in FIG. 8B, the aluminum film is patterned so as to form gate electrodes 215 and 216.

Next, as the impurities, phosphorus ions are implanted into the active region 212, and in turn, boron ions are implanted into the active region 213 by an ion doping method using the gate electrodes 215 and 216 as masks, respectively. These implantation steps are conducted under the following conditions: phosphine ($PH_3$) and diborane ($B_2H_6$) are used as a doping gas, respectively; the accelerating voltage for the active region 212 is set to be 60 to 90 keV, e.g., 80 keV, while the accelerating voltage for the active region 213 is set to be 40 to 80 keV, e.g., 65 keV; and the implant dose is set to be $1\times10^{15}$ to $8\times10^{15}$ cm$^{-2}$, e.g., $2\times10^{15}$ cm$^{-2}$ (phosphorus) and $5\times10^{15}$ cm$^{-2}$ (boron). The regions 217, 218, 219 and 220 into which the impurities are implanted during these steps will be used as the source and the drain regions of TFTs, while the regions into which no impurities are implanted being masked by the gate electrodes 215 and 216 will be used as the channel regions of a TFT. During these doping steps, the selective doping of the respective elements becomes possible by covering the regions, other than the regions to be doped, with a photoresist. As a result, N-type impurity regions 217 and 218 and P-type impurity regions 219 and 220 are formed, thereby realizing the N-channel type TFT and the P-channel type TFT as shown in FIG. 8D.

Thereafter, as shown in FIG. 8C, the annealing is conducted by the laser beam irradiation so as to activate the implanted impurities. In this example, a KrF excimer laser (wavelength: 248 nm; pulse width: 20 nsec) is used as a laser beam. The irradiation condition is determined as follows. The energy density is set to be 250 mJ/cm$^2$, and several shots of laser beams are irradiated onto a point.

Then, as shown in FIG. 8D, an interlayer insulating film 221 made of silicon oxide having a thickness of about 600 nm is formed by a plasma CVD method, or the like. Next, the contact holes are formed in the interlayer insulating film 221, and the electrode lines 222, 223 and 224 are formed by using the multilayered film composed of a metal material such as titanium nitride and aluminum so as to be connected to the source and the drain regions 217, 218, 219 and 220. Finally, the annealing is conducted at 350° C. for 30 minutes under hydrogen plasma atmosphere, thereby completing the TFT.

In the circuit of the CMOS structure thus obtained, both field-effect mobilities for the N-type TFT and the P-type TFT are very high, i.e., 200 to 300 $cm^2/Vs$ and 150 to 230 $cm^2/Vs$, respectively.

EXAMPLE 3

In Example 3, a crystalline silicon film is formed by a different method from those of Examples 1 and 2. FIG. 9 is a plan view showing the production process of the crystalline silicon film in this example. FIGS. 10A to 10E are cross-sectional views taken along the line F-F' in FIG. 9. The production steps proceed in the order of these FIGS. 10A to 10E.

First, by conducting the same production steps as those shown in FIGS. 2A to 2D of Example 1, or those shown in FIGS. 6A to 6D of Example 2, a crystalline silicon film 303b grown laterally is formed on the glass substrate 301. In FIG. 9, a crystalline silicon film 303a is formed in a longitudinal direction, i.e., the direction vertical to the substrate 301, inside the region 305 into which a very small amount of nickel is locally added. On the other hand, in the regions surrounding the region 305, the crystal is grown from the region 305 in a lateral direction (i.e., the direction parallel to the substrate 301) as indicated by the arrows 307 in FIG. 9, so that the crystalline silicon film 303b is grown laterally. In the other regions, the amorphous silicon film remains the same. In this case, FIGS. 2C and 2D and FIGS. 6C and 6D correspond to the cross section taken along the line E-E' in FIG. 9.

Figure 10A:
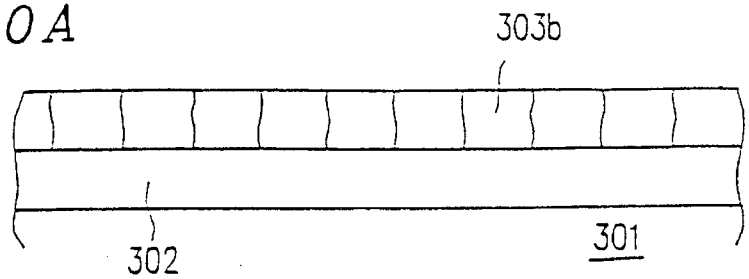
FIGS. 10A to 10E are cross-sectional views taken along the line F-F' in FIG. 9.

The crystalline silicon film 303b grown laterally consists of needle-like or column-like crystals extending orderly along the crystal-growing direction. If the crystalline silicon film 303b is seen from the cross section taken along the line F-F' in FIG. 9, there is no grain boundary between the top and the bottom of the crystalline silicon film 303b, as shown in FIG. 10A.

Figure 10B:
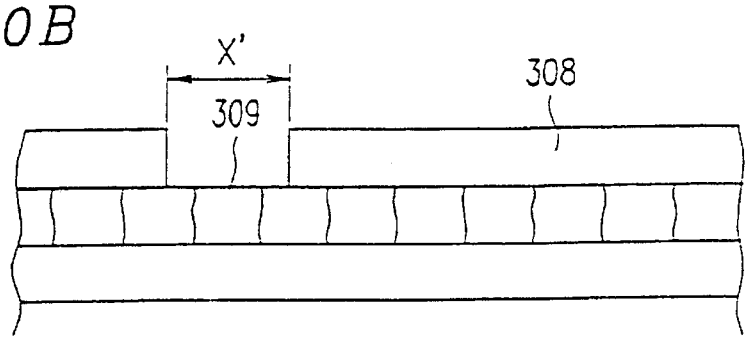

Next, as shown in FIG. 10B, an insulating thin film 308 made of silicon oxide or the like having a thickness of 10 to 100 nm, e.g., 20 nm, is formed on the crystalline silicon film 303 including the crystalline silicon film regions 303a and 303b and the amorphous silicon film region. Subsequently, the silicon oxide film 308 is partially removed so as to be linearly patterned along the crystal-growing direction 307 of the crystalline silicon film 303b grown laterally. Seeing the crystalline silicon film 303b from above the upper surface of the substrate 301, as shown in FIG. 9, the crystalline silicon film 303b is exposed though a slit-shaped window 309 formed in the insulating thin film 308. In this case, if the width X' of the slit-shaped window 309 is set to be equal to or less than the crystal width of the needle-like or column-like crystal, more specifically 200 nm or less, then no grain boundary or only one grain boundary exists in the crystalline silicon film 303b exposed through the slit-shaped window 309, thereby realizing a satisfactory crystallinity as a seed crystal. On the other hand, if the width X' of the slit-shaped window 309 is set to be more than 200 nm, then at least two needle-like or column-like crystals are arranged in the crystalline silicon film 303b exposed through the slit-shaped window 309. However, even in such a case, one needle-like or column-like crystal is arranged on each side along the crystal-growing direction, i.e., the direction indicated by the line E-E' in FIG. 9. Therefore, in the case where the crystalline silicon film 303b is grown using the two needle-like or column-like crystals as the seed crystals along the direction indicated by the line F-F' in FIG. 9, no particular problem occurs even if the grown crystals are used for the element regions. In this example, the slit-shaped window 309 is formed in the insulating thin film 308 with the width X' of the slit-shaped window 309 set to be 500 nm.

Figure 10C:
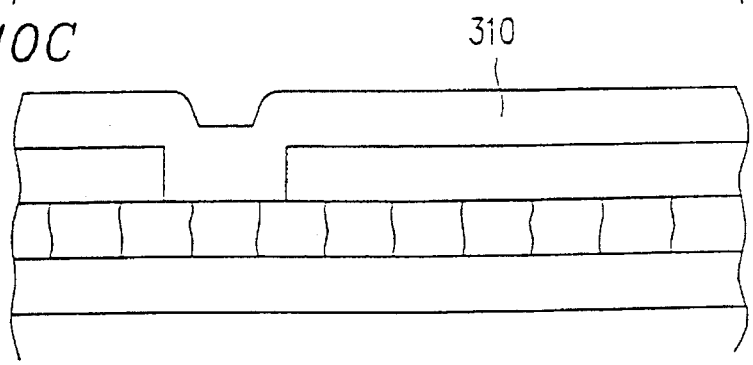
Figure 10D:
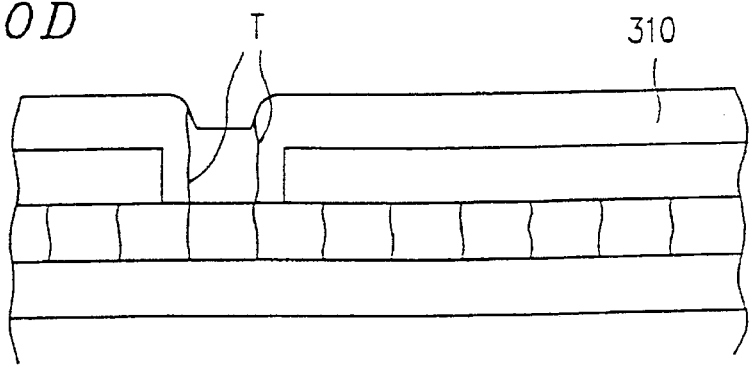

Subsequently, as shown in FIG. 10C, a second amorphous silicon film 310 having a thickness of about 50 nm is deposited thereon by a low-pressure CVD method or the like, and then subjected to a heat treatment at a temperature in the range of 550° to 600° C. for several tens of hours under an inert gas, e.g., nitrogen gas atmosphere, using an electric furnace or the like. As a result, the second amorphous silicon film 310 is crystallized by using the portion of the crystalline silicon film 303b exposed through the slit-shaped window 309 (consisting of the needle-like or column-like crystals as the seed crystals, so as to form a crystalline silicon film 310. In this case, as shown in FIG. 10D, the grain boundaries T are formed with the slit-shaped window 309, because the crystallinity of the laterally crystallized silicon film 303b under the window 309 is reflected. On the other hand, the crystalline silicon film 310 without any grain boundaries is formed from the both sides of the slit-shaped window 309.

Figure 10E:
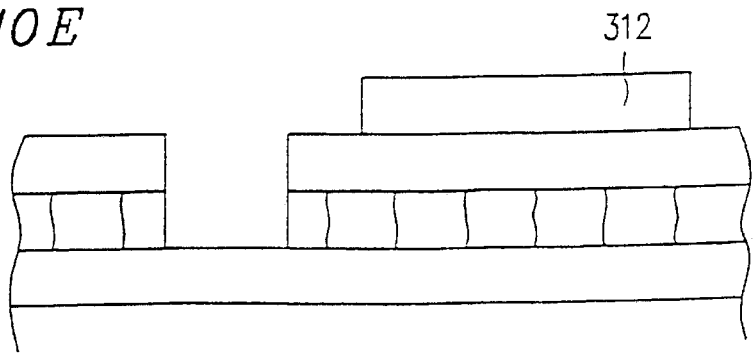

And then, as shown in FIG. 10E, all of the regions of the crystalline silicon film 310, except for the region patterned for use as an active region (element region) 312 for each TFT, are removed by the etching technique, thereby isolating the respective TFTs. The crystalline silicon film region 312 fabricated in the above-described manner exhibits a crystallinity almost as excellent as a single crystalline silicon. Such an excellent quality of the crystalline silicon film to be formed on the glass substrate could not be obtained by any other conventional method.

Using the crystalline silicon film region 312 thus obtained as the active region for a TFT, a desired semiconductor device is fabricated in the same way as in Examples 1 and 2.

In the semiconductor device to-be obtained, the active region 312 of the TFT is made of a crystalline silicon film exhibiting a crystallinity almost as excellent as a single crystalline silicon, so that a very high field-effect mobility may be obtained. Specifically, the field-effect mobility of the electrons is 250 $cm^2/Vs$ or more, while the field-effect mobility of the holes is 150 $cm^2/Vs$ or more.

In this example, during the second-stage solidphase epitaxy, not a laser annealing but a furnace annealing is conducted. Accordingly, the crystalline silicon film 310 exhibits a crystallinity of high uniformity over a wide range of the upper surface of the glass substrate 301. As a result, in the case where a large number of TFTs are arranged on the glass substrate 301, the dispersion among the characteristics (the mobility or the like) of the respective TFTs is not likely to occur.

EXAMPLE 4

Figure 11:
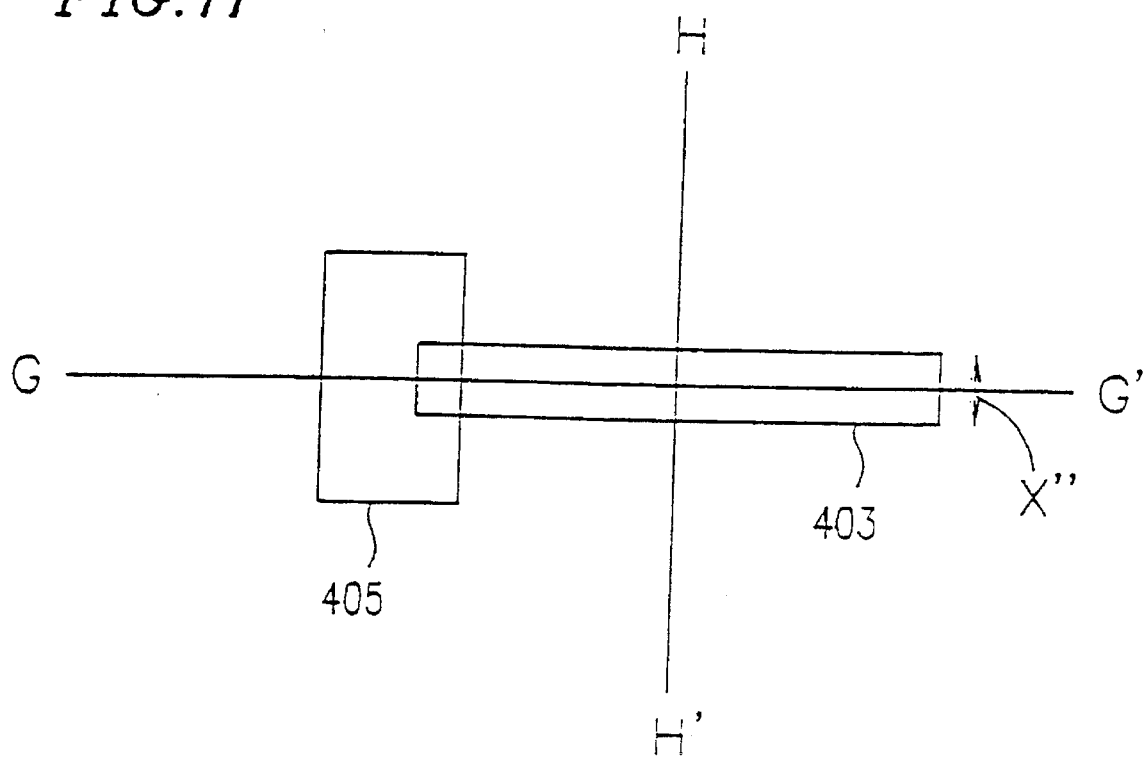
FIG. 11 is a plan view showing a production process of a crystalline silicon film in a semiconductor device according to the third example of the present invention.

In Example 4, a crystalline silicon film is formed by a different method from those of Examples 1, 2 and 3. FIG. 11 is a plan view showing the production process of the crystalline silicon film in this example. FIGS. 12A to 12E are cross-sectional views taken along the line G-G' in FIG. 11. FIGS. 13A to 13D are cross-sectional views taken along the line H-H' in FIG. 11. The production steps proceed in the order of these FIGS. 12A through 13D.

First, an underlying film 402 made of silicon oxide having a thickness of about 100 nm is formed on the glass substrate 401 by a sputtering technique or the like. A first intrinsic (type I) amorphous silicon film 403 having a thickness of 40 nm is deposited by a plasma CVD method or the like on the underlying film 402. The thickness of the amorphous silicon film 403 is suitably in the range of 25 to 100 nm.

Figure 12A:
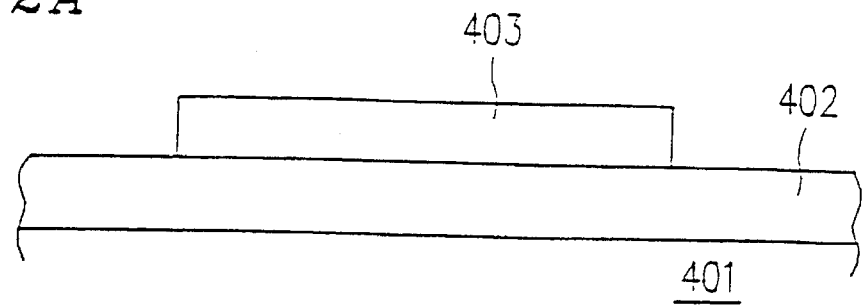
FIGS. 12A to 12E are cross-sectional views taken along the line G-G' in FIG. 11.

Then, the amorphous silicon film 403 is linearly patterned, thereby removing the redundant portions so as to form a long island-shaped amorphous silicon film 403 as shown in FIGS. 11 and 12A.

Figure 12B:
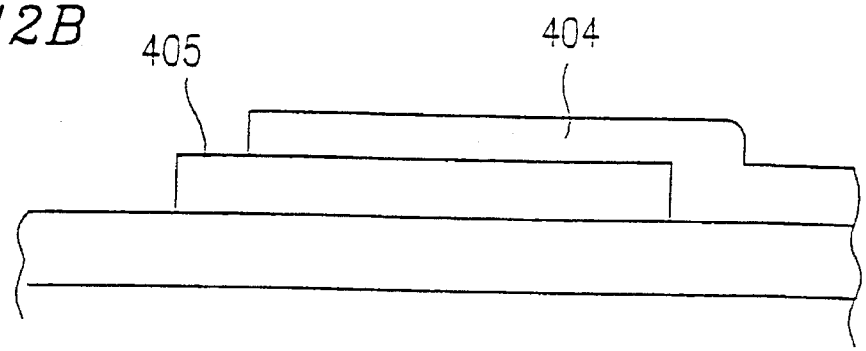

Next, as shown in FIG. 12B, a mask 404 having a thickness of about 50 nm is formed on the island-shaped amorphous silicon film 403 by using an insulating thin film made of silicon oxide, silicon nitride, or the like, and then the mask 404 is selectively removed so as to form a window 405 for introducing catalyst elements. If the film under this state is seen from above the upper surface of the substrate, as shown in FIG. 11, the end portion of the first amorphous silicon film 403 formed linearly is exposed through the window 405, while the remaining portion is still masked.

Figure 12C:
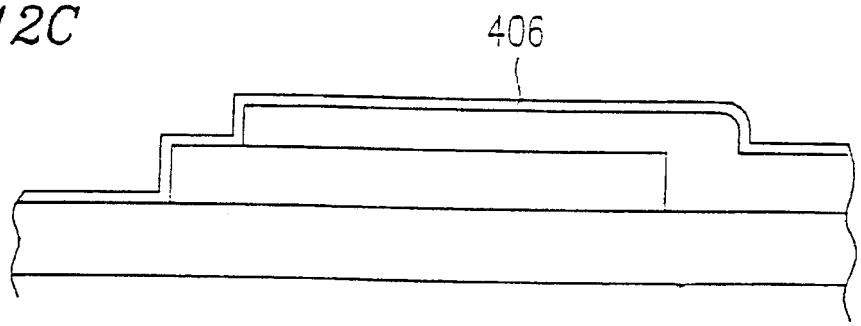
Figure 12D:
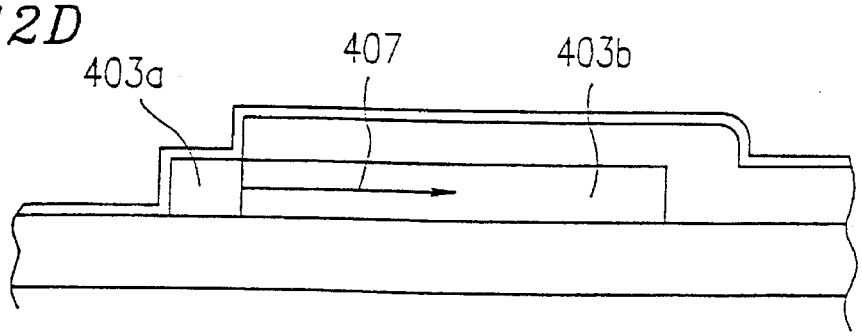

Subsequently, as shown in FIG. 12C, a nickel film 406 having a thickness of 1 nm is deposited on the mask 404 by a vapor deposition technique or the like. The thickness of the nickel film 406 is suitably in the range of 0.5 to 20 nm. As a result, a very small amount (on the order of $1\times10^{18}$ $cm^{-3}$) of nickel is locally added to the end portion of the amorphous silicon film 403 through the window 405. Then, the portion of the amorphous silicon film 403 is annealed at a temperature of 550° C. for 16 hours under a hydrogen-reduction atmosphere or under an inert ambient so as to be crystallized.

In this case, the first amorphous silicon film 403 is crystallized in a direction vertical to the substrate 401 in the portion of the amorphous silicon film 403 (defined by the window 405) into which a very small amount of nickel is locally added, so that a crystalline silicon film 403a is formed. On the other hand, in the regions surrounding the crystalline silicon film 403a, the crystal is growing from the crystalline silicon film 403a in a lateral direction (i.e., the direction parallel to the substrate 401) as indicated by the arrow 407 in FIG. 12D, so that the crystalline silicon film 403b is grown laterally. In this case, if the line width X" of linear amorphous silicon film 403 is set to be equal to or less than 200 nm, then the crystalline silicon film 403b to be obtained becomes a silicon film under a single crystalline state having no grain boundaries. Since the crystal width of each needle-like or column-like crystal constituting the crystalline silicon film 403b grown laterally is approximately 200 nm, the linearly patterned amorphous silicon film 403 is crystallized as one needle-like or column-like crystal.

Figure 12E:
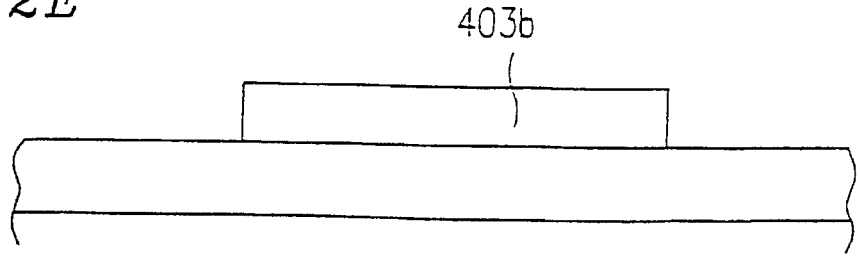

Next, as shown in FIG. 12E, the crystalline silicon film 403a formed in the end portion of the amorphous silicon film 403 (defined by the window 405) into which a very small amount of nickel is added and the mask 404 is removed, thereby obtaining an island-shaped crystalline silicon film 403b as shown in FIG. 12E. FIG. 13F shows the cross section of the crystalline silicon film 403b under this state taken along the line H-H' in FIG. 11.

Figure 13A:
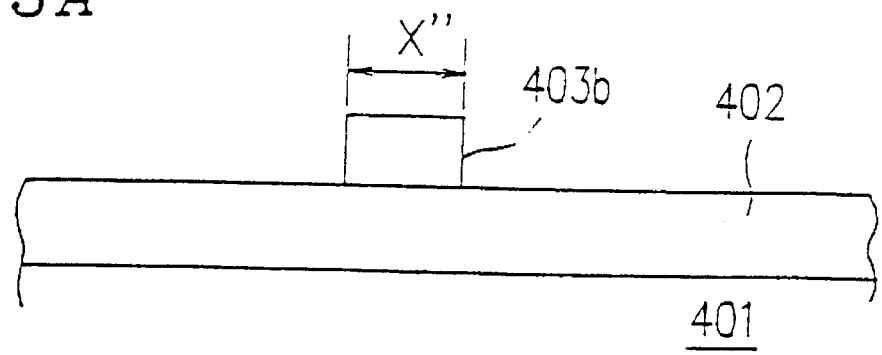
FIGS. 13A to 13D are cross-sectional views taken along the line H-H' in FIG. 11.
Figure 13B:
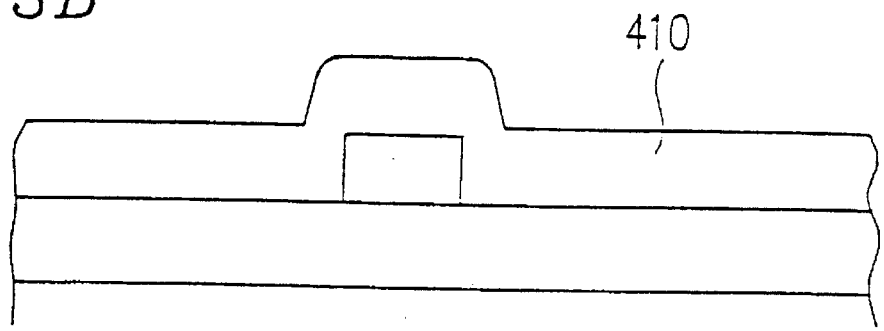
Figure 13C:
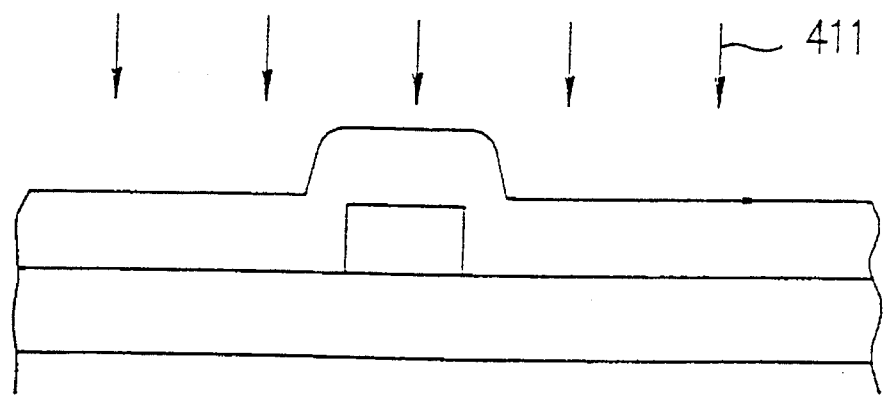

Subsequently, as shown in FIG. 13B, a second amorphous silicon film 410 having a thickness of about 80 nm is deposited on the island-shaped crystalline silicon 403b by a low-pressure CVD method or the like. Then, as shown in FIG. 13C, the film 410 is irradiated with a laser beam 411. As a result, the second amorphous silicon film 410 is crystallized using the island-shaped crystalline silicon film (or the needle-like or column-like crystal) 403b as the seed crystal, so as to form a crystalline silicon film 410.

Figure 13D:
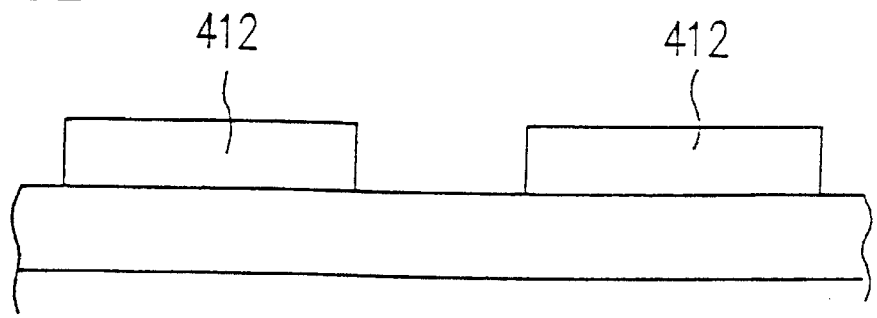
Figure 14:
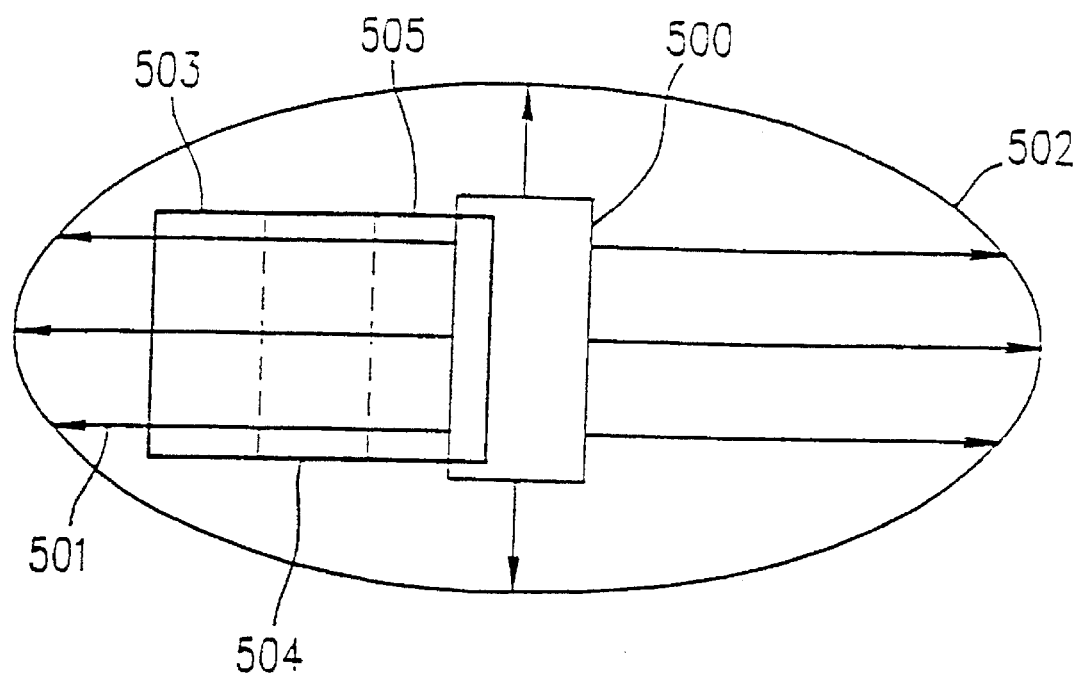
FIG. 14 is a plan view showing a production process of a crystalline silicon film in a conventional semiconductor device.

And then, as shown in FIG. 13D, all of the regions of the crystalline silicon film 410, except for the regions to be used as active regions (element regions) 412 for TFTs, are removed by an etching technique, thereby isolating the respective TFTs. The crystalline silicon film regions 412 fabricated in the above-described manner exhibit a crystallinity almost as excellent as that of a single crystalline silicon. Such an excellent crystallinity of the crystalline silicon film to be formed on the glass substrate could not be obtained by any other conventional method.

Using the crystalline silicon film regions 412 thus obtained as the active region for TFTs, a desired semiconductor device is fabricated in the same way as in Examples 1 and 2.

In the semiconductor device to be obtained, the active regions 412 of the TFTs are made of the crystalline silicon film exhibiting a crystallinity almost as excellent as a single crystalline silicon, so that a very high field-effect mobility may be obtained. Specifically, the field-effect mobility of the electrons is 250 $cm^2/Vs$ or more, while the field-effect mobility of the holes is 150 $cm^2/Vs$ or more.

The present invention has been specifically described by way of illustrative examples. It is noted that the present invention is not limited to the above-described examples, but that various modifications are possible based on the spirit of the present invention.

For example, in the above-described Examples 1 to 4, a very small amount of nickel is locally added by applying an aqueous solution of a nickel salt on the surface of a first amorphous silicon film 103, 203, 303, or 403 or by forming a nickel silicide thin film or a nickel thin film (such a film is so thin that it is difficult to observe the film) on the first amorphous silicon film, thereby introducing nickel into the amorphous silicon film, and then the crystals are grown from the nickel-introduced portions. Alternatively, a very small amount of nickel may be locally added onto the lower surface of the first amorphous silicon film 103, 203, 303, or 403 to be formed. That is to say, the very small amount of nickel may be added either onto the upper surface thereof or onto the lower surface thereof, and therefore the crystals may be grown either from the upper side or from the lower side of the amorphous silicon film. Alternatively, an amorphous silicon film is formed beforehand, and then nickel ions may be selectively implanted to the amorphous silicon film by an ion doping method. In such a case, the concentration of nickel element can be precisely controlled. Alternatively, a very small amount of nickel may be added by processing the amorphous silicon film with plasma using Ni electrodes, in place of depositing a nickel thin film. As the catalyst element for promoting the crystallization, nickel is most suitable for obtaining remarkable effects. However, remarkable effects may also be attained in the case of using cobalt, palladium, platinum, copper, silver, gold, indium, tin, aluminum, phosphorus, arsenic, or antimony, or a combinations thereof, as a catalyst element. One or a plurality of catalyst elements selected from the group mentioned above has an effect of promoting the crystallization even in the case of adding a very small amount (on the order of $1\times10^{18}$ cm$^{-3}$) of such an element. Accordingly, such an element does not affect a semiconductor device adversely.

In the above-described examples, heat treatment is conducted using an excimer laser (or pulse laser) beam. Alternatively, other kinds of laser beams (e.g., a continuously oscillating Ar laser beam) may also be used for heat treatment. In addition, a so-called rapid thermal annealing (RTA) or a rapid thermal process (RTP) for heating a sample to a temperature of 1000° to 1200° C. (i.e., the temperature of a silicon monitor) in a short period of time by using an intense light having almost the same intensity as that of a laser beam, e.g., an infrared light and a flash lamp may also be utilized. As described in Example 3, satisfactory effects may be obtained in the case of conducting a conventional heat treatment (furnace anneal) only. However, in the case of irradiating a laser beam or an intense light, a crystalline silicon film having excellent crystallinity reflecting the crystallinity of a needle-like or column-like crystal to be used as a seed crystal can be easily obtained.

Moreover, the present invention is applicable to various devices other than an active-matrix substrate for a liquid crystal display. For example, the invention is applicable to various devices such as a close-contact type image sensor, a driver-monolithic thermal head, a driver-monolithic optical write device or display device using organic electroluminescent (EL) elements as light-emitting elements, and a semiconductor device such as a three-dimensional IC. In the case of applying the present invention to these devices, high-performance characteristics such as a fast response and a high resolution may be realized for these devices. Furthermore, the present invention is applicable to semiconductor processes and semiconductor devices in general; not only to an MOS type transistor described in the above-described examples, but also to a bipolar transistor and an electrostatic induction transistor using a crystalline semiconductor as a material for the device.

Figure 15:
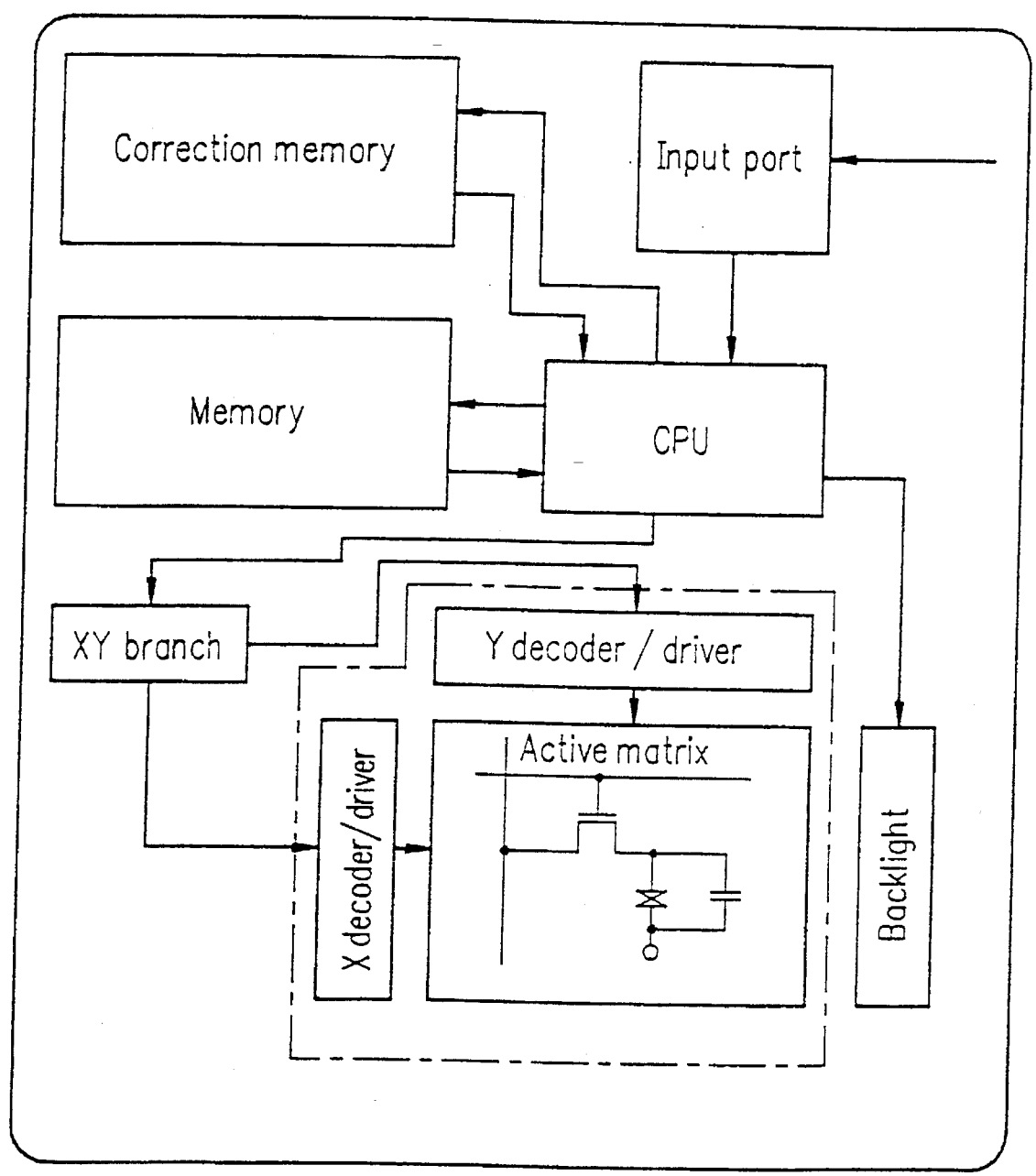
FIG. 15 is a block diagram showing an electrooptic system of a liquid crystal display device.

As described above, since the field-effect mobility in the TFT obtained by the method of the present invention is very high, it becomes possible to form a CPU using an insulating substrate, not by the use of a single crystalline silicon substrate (chip) as conventionally utilized. As a result, in the case where the present invention is applied to an active-matrix substrate for a liquid crystal display, as shown in FIG. 15, a CPU may be incorporated on an insulating substrate (e.g., a glass substrate). Consequently, according to the present invention, it is possible to incorporate, on an insulating substrate, a high-performance CPU operating at as high a speed as that of the CPU formed on a single crystalline silicon substrate. In addition, all the circuits, except for the CPU, may be provided on one and the same insulating substrate. In such a case, it is not necessary to produce all the circuits (or all the semiconductor devices) by the method of the present invention. It is possible that the production method of the present invention is applied only to a semiconductor device which is required to operate at a high rate.

As is apparent from the foregoing detailed description, according to the present invention, in a semiconductor device including an active region made of a crystalline silicon film on a substrate having an insulating surface, a crystalline silicon film is formed by growing a second amorphous silicon film by using as seed crystals the needle-like or column-like crystals grown by introducing catalyst elements for promoting the crystallization into a first amorphous silicon film and then by heating the first amorphous silicon film, so that a crystalline silicon film exhibiting a crystallinity almost as excellent as that of a single crystal may be obtained. In the case of forming a TFT on a glass substrate by using the crystalline silicon film thus obtained as an active region, a TFT having a mobility almost as high as that of a TFT in which an active region is formed on a single crystalline silicon substrate. There has been no technology for producing a TFT having such a high mobility on an inexpensive glass substrate with satisfactory reproducibility. However, by applying the present invention to a liquid crystal display device, an integrated circuit including various devices such as a display, an X/Y driver, a CPU and a memory on glass substrate, which could not be obtained by any other conventional technology, is realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising an active region made of a crystalline silicon film on an insulating surface of a substrate, wherein the active region is formed by introducing at least one kind of catalyst elements for promoting a crystallization into a first amorphous silicon film; heating the first amorphous silicon film so as to grow needle-like or column-like crystals; and crystallizing a second amorphous silicon film using the needle-like or column-like crystals as seed crystals that are removed after the second amorphous silicon film has crystallized;

wherein the first and second films crystallize to substantially the same extent such that the first film has a column-like structure and a grain boundary exists, and the second film has an almost single crystalline structure.

2. A semiconductor device according to claim 1, wherein a thickness of the needle-like or column-like crystals used as the seed crystals is 100 nm or less.

3. A semiconductor device according to claim 1, wherein the second amorphous silicon film is crystallized by irradiating a laser beam or an intense light.

4. A semiconductor device according to claim 1, wherein at least one kind of catalyst elements are selected from a group consisting of Ni, Co, Pd, Pt, Cu, Ag, Au, In, Sn, Al, P, As and Sb.

5. A semiconductor device according to claim 1, wherein the substrate is made of glass having a distortion point of 700° C. or less, and a crystallinity of the active region is substantially equal to a crystallinity of a single crystal.

6. A semiconductor device according to claim 5 further comprising a central processing unit formed on the substrate, the central processing unit comprising a thin-film transistor including at least a part of the active region.

7. A semiconductor device according to claim 5, wherein the distortion point of the glass is 650° C. or less.

8. A semiconductor device according to claim 5, wherein the active region has a field-effect mobility of 200 cm$^2$/Vs or more with respect to electrons.

9. A semiconductor device according to claim 5, wherein the active region has a field-effect mobility of 150 cm$^2$/Vs or more with respect to holes.

* * * * *